(12) United States Patent
Ohashi et al.

(10) Patent No.: US 10,503,152 B2
(45) Date of Patent: Dec. 10, 2019

(54) METHOD OF MANUFACTURING SEMICONDUCTOR DEVICE

(71) Applicant: Kokusai Electric Corporation, Tokyo (JP)

(72) Inventors: Naofumi Ohashi, Toyama (JP); Toshiyuki Kikuchi, Toyama (JP); Shun Matsui, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/135,930

(22) Filed: Sep. 19, 2018

(65) Prior Publication Data

US 2019/0294151 A1    Sep. 26, 2019

(30) Foreign Application Priority Data

Mar. 26, 2018    (JP) .................................. 2018-057986

(51) Int. Cl.
*G05B 19/4155*    (2006.01)
*C23C 16/54*    (2006.01)
*C23C 16/52*    (2006.01)

(52) U.S. Cl.
CPC .......... *G05B 19/4155* (2013.01); *C23C 16/52* (2013.01); *C23C 16/54* (2013.01); *G05B 2219/45031* (2013.01)

(58) Field of Classification Search
None
See application file for complete search history.

(56) References Cited

U.S. PATENT DOCUMENTS 5,943,230 A * 8/1999 Rinnen ............. H01L 21/67167
427/255.5
6,745,093 B1 * 6/2004 Kawano ............. G05B 19/41865
700/112
(Continued)

FOREIGN PATENT DOCUMENTS

JP            4986784 B2    5/2012
JP       2014-120618 A      6/2014
(Continued)

*Primary Examiner* — Ryan A Jarrett
(74) *Attorney, Agent, or Firm* — Edell, Shapiro & Finnan, LLC

(57) ABSTRACT

Described herein is a technique capable of improving the productivity of a substrate processing system including a plurality of process chambers. According to the technique described herein, there is provided a method of manufacturing a semiconductor device, including: (a) placing a storage container accommodating substrates on a loading port shelf; (b) transferring the substrates in a predetermined order from the storage container to process chambers capable of processing the substrates; (c) perform a substrate processing in the process chambers; (d) generating first count data corresponding to the processing chambers; (e) storing the first count data; (f) assigning transfer flag data to one of the process chambers next to another of the process chambers corresponding to a maximum count number of the first count data; and (g) transferring substrates accommodated in a next storage container of the storage container in the predetermined order based on the transfer flag data.

12 Claims, 14 Drawing Sheets

(56) References Cited

U.S. PATENT DOCUMENTS

2012/0303158 A1\* 11/2012 Nakata ............. G05B 19/41865
                                                                                                                  700/228
2017/0092517 A1\* 3/2017 Ohashi ............. H01L 21/67196

FOREIGN PATENT DOCUMENTS

| | | | |
|---|---|---|---|
| JP | 5571122 | B2 | 7/2014 |
| JP | 6089082 | B1 | 2/2017 |
| JP | 6105436 | B2 | 3/2017 |

\* cited by examiner

| PM | PM1 | | PM2 | | PM3 | | PM4 | |
|---|---|---|---|---|---|---|---|---|
| CHAMBER | 100a | 100b | 100c | 100d | 100e | 100f | 100g | 100h |
| PROCESSING TIME (ARBITRARY UNIT) | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | | | | | | |

| PM | PM1 | | PM2 | | PM3 | | PM4 | | MAXIMUM − MINIMUM |
|---|---|---|---|---|---|---|---|---|---|
| CHAMBER | 100a | 100b | 100c | 100d | 100e | 100f | 100g | 100h | |
| ACCUMULATED PROCESSING TIME | 32 | 24 | 24 | 24 | 24 | 24 | 24 | 24 | 8 |

ACCUMULATED PROCESSING TIME

| PM | PM1 | | PM2 | | PM3 | | PM4 | |
|---|---|---|---|---|---|---|---|---|
| CHAMBER | 100a | 100b | 100c | 100d | 100e | 100f | 100g | 100h |
| PROCESSING TIME (ARBITRARY UNIT) | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | | | 1 | 1 |
| | 1 | 1 | 1 | 1 | 1 | 1 | 1 | 1 |
| | 1 | 1 | 1 | 1 | 1 | 1 | 1 | |
| | 1 | 1 | 1 | 1 | 1 | 1 | 1 | 1 |
| | 1 | 1 | 1 | 1 | 1 | 1 | 1 | 1 |
| | 1 | | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | | | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | |

| PM | PM1 | | PM2 | | PM3 | | PM4 | | MAXIMUM − MINIMUM |
|---|---|---|---|---|---|---|---|---|---|
| CHAMBER | 100a | 100b | 100c | 100d | 100e | 100f | 100g | 100h | |
| ACCUMULATED PROCESSING TIME | 26 | 24 | 26 | 24 | 26 | 24 | 26 | 24 | 2 |

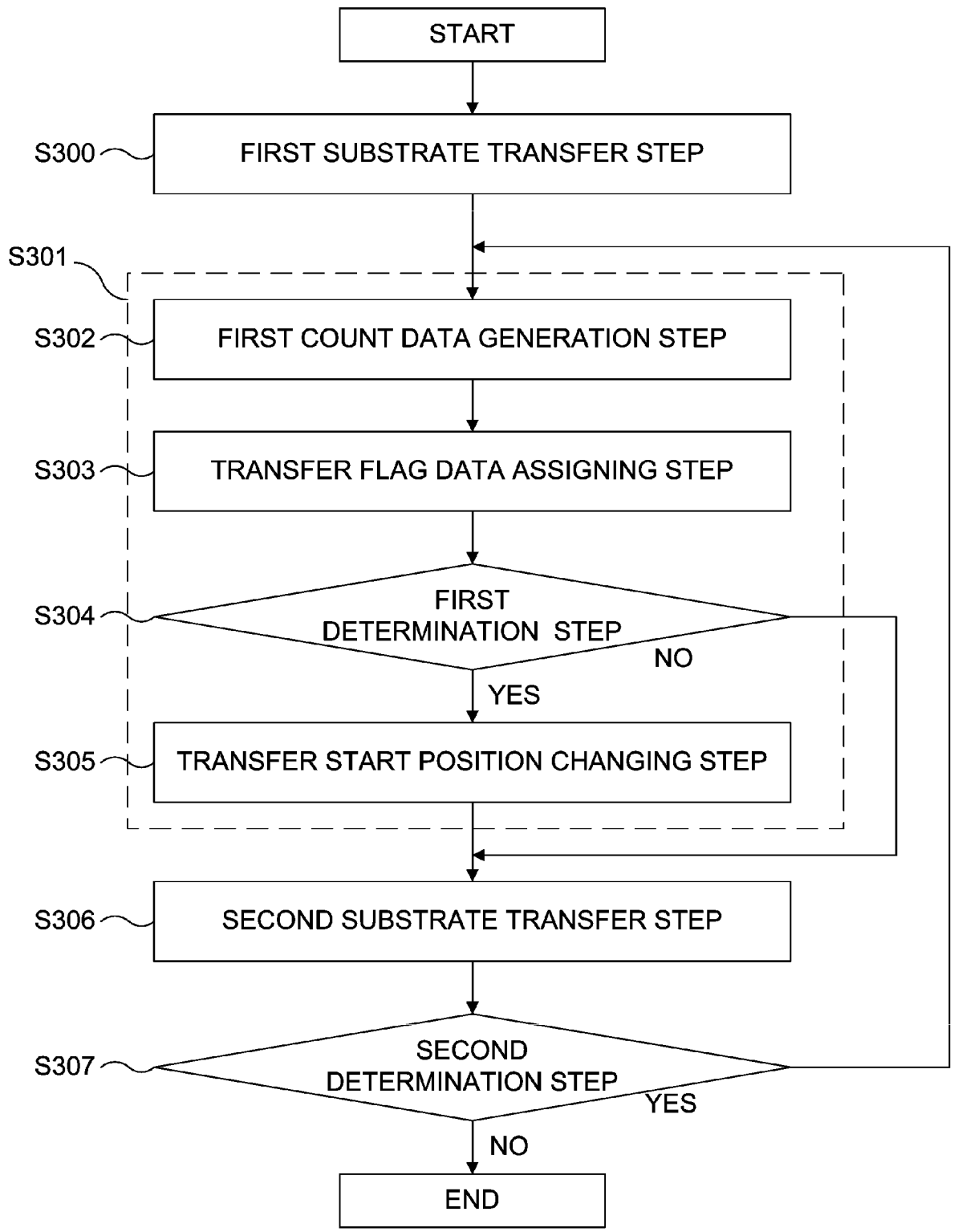

FIG. 12

| FIRST COUNT DATA \ CHAMBER | CHAMBER 100a | CHAMBER 100b | CHAMBER 100c | ... | CHAMBER 100h |
|---|---|---|---|---|---|
| ACCUMULATED PROCESSING TIME ※ WITH SUBSTRATE [ARBITRARY UNIT] | A1  400 | B1  300 | C1  300 | ... | H1  300 |
| ACCUMULATED TIME OF MAINTAINING TEMPERATURE [ARBITRARY UNIT] | A2  1200 | B2  1200 | C2  1200 | ... | H2  1200 |
| ACCUMULATED SUPPLY AMOUNT OF PROCESS GAS [ARBITRARY UNIT] | A3  500 | B3  500 | C3  500 | ... | H3  500 |
| ACCUMULATED TIME OF MAINTAINING PROCESS PRESSURE [ARBITRARY UNIT] | A4  400 | B4  300 | C4  300 | ... | H4  300 |
| ACCUMULATED FILM THICKNESS [ARBITRARY UNIT] | A5  3 | B5  2 | C5  2 | ... | H5  2 |
| SUPPLY AMOUNT OF HIGH FREQUENCY POWER [ARBITRARY UNIT] | A6  400 | B6  300 | C6  300 | ... | H6  300 |

FIG. 13

| FIRST COUNT DATA / CHAMBER | PM1 | | PM2 | ... | PM4 |
|---|---|---|---|---|---|
| | CHAMBER 100a | CHAMBER 100b | CHAMBER 100c | ... | CHAMBER 100h |
| ACCUMULATED PROCESSING TIME ※ WITH SUBSTRATE [ARBITRARY UNIT] | A1　400 | B1　300 | C1　300 | ... | H1　300 |

| TRANSFER FLAG | Xa　1 | Xb　0 | Xc　0 | ... | Xh　0 |

FIG. 14

| FIRST COUNT DATA | PM1 | | PM2 | | ... | PM4 | |
|---|---|---|---|---|---|---|---|
| | CHAMBER 100a | CHAMBER 100b | CHAMBER 100c | CHAMBER 100d | ... | CHAMBER 100g | CHAMBER 100h |
| ACCUMULATED PROCESSING TIME ※ WITHOUT SUBSTRATE [ARBITRARY UNIT] | A1 400 | B1 0 | C1 300 | D1 300 | ... | G1 300 | H1 300 |

| SECOND COUNT DATA | AB1 | CD1 | ... | GH1 |
|---|---|---|---|---|
| ACCUMULATED PROCESSING TIME ※ WITHOUT SUBSTRATE | 400 | 600 | ... | 600 |

| TRANSFER FLAG | Xab | Xcd | ... | Xgh |
|---|---|---|---|---|
| ※ WITHOUT SUBSTRATE | 0 | 1 | ... | 0 |

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2018-057986 filed on Mar. 25, 2018, the entire contents of which are hereby incorporated by reference.

TECHNICAL FIELD

The present disclosure relates to a method of manufacturing a semiconductor device.

BACKGROUND

Recently, semiconductor devices have been manufactured in small lots and various types of products. When semiconductor devices are manufactured in small lots and various types of the products, it is required to improve the productivity. As one method that satisfies this requirement, there is a method for improving the productivity of a substrate processing system such as a single substrate processing apparatus including a plurality of process chambers.

However, the productivity may be reduced by the mismatch between the number of process chambers installed in the substrate processing system and the number of substrates to be processed.

SUMMARY

Described herein is a technique capable of improving the productivity of a substrate processing system including a plurality of process chambers.

According to one aspect of the technique described herein, there is provided a method of manufacturing a semiconductor device including: (a) placing a storage container where substrates are accommodated on a loading port shelf; (b) transferring the substrates in a predetermined order from the storage container to process chambers capable of processing the substrates; (c) perform a substrate processing in each of the process chambers; (d) generating first count data corresponding to each of the processing chambers; (e) storing the first count data; (f) assigning transfer flag data to one of the process chambers next to another of the process chambers corresponding to a maximum count number of the first count data; and (g) transferring substrates accommodated in a next storage container of the storage container in the predetermined order based on the transfer flag data.

BRIEF DESCRIPTION OF THE DRAWINGS

FIG. 11 is a flowchart illustrating a substrate transfer sequence according to the embodiment.

FIG. 12 schematically exemplifies a data table of first count data according to the embodiment.

FIG. 13 schematically exemplifies the first count data and a transfer flag thereof according to the embodiment.

FIG. 14 schematically exemplifies a second count data and a transfer flag thereof according to the embodiment.

DETAILED DESCRIPTION

Embodiment

Hereinafter, an embodiment will be described with reference to the drawings.

Hereinafter, a substrate processing system preferably used in the embodiment will be described.

(1) Configuration of Substrate Processing System

Figure 1:
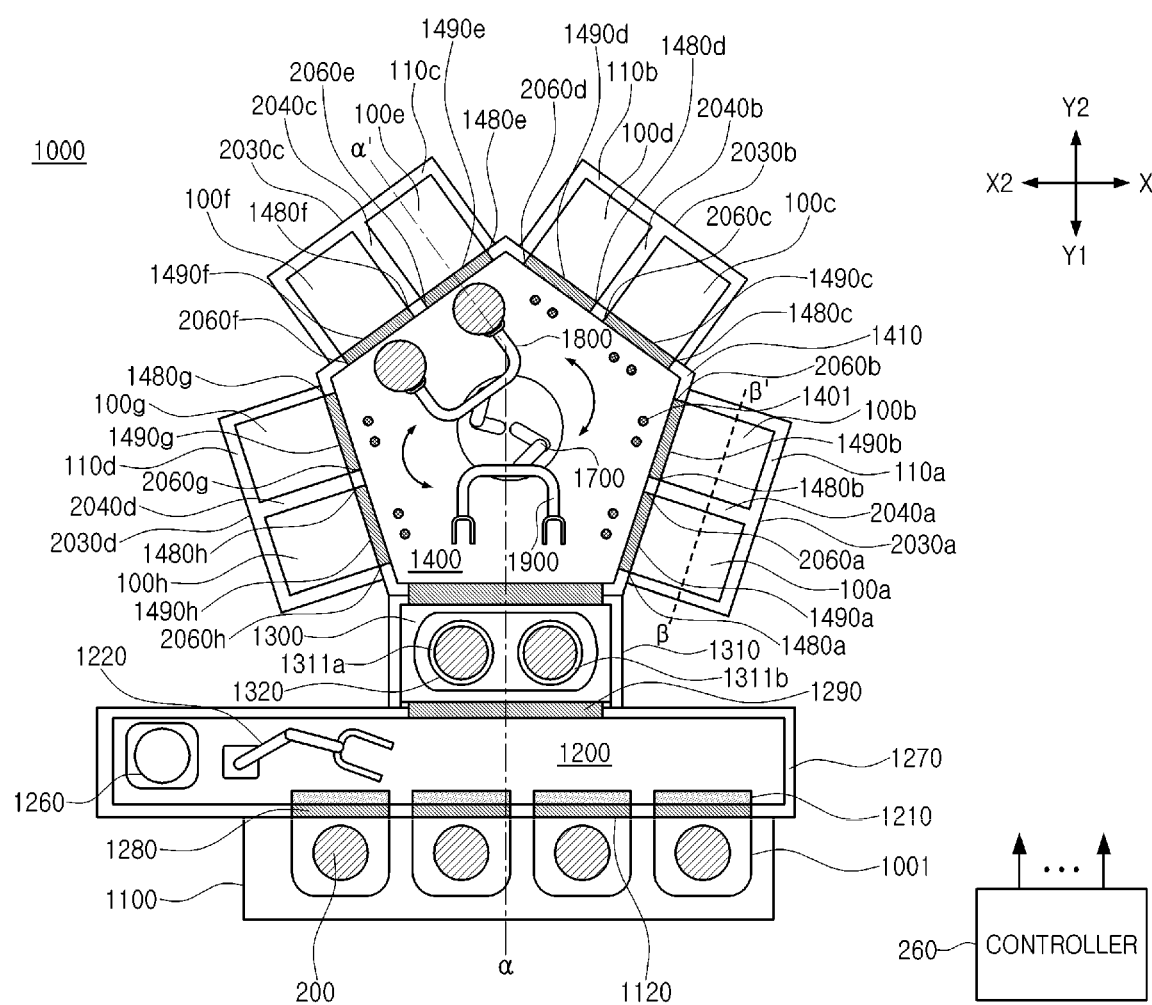
FIG. 1 schematically illustrates a horizontal cross-section of a substrate processing system preferably used in an embodiment described herein.
Figure 2:
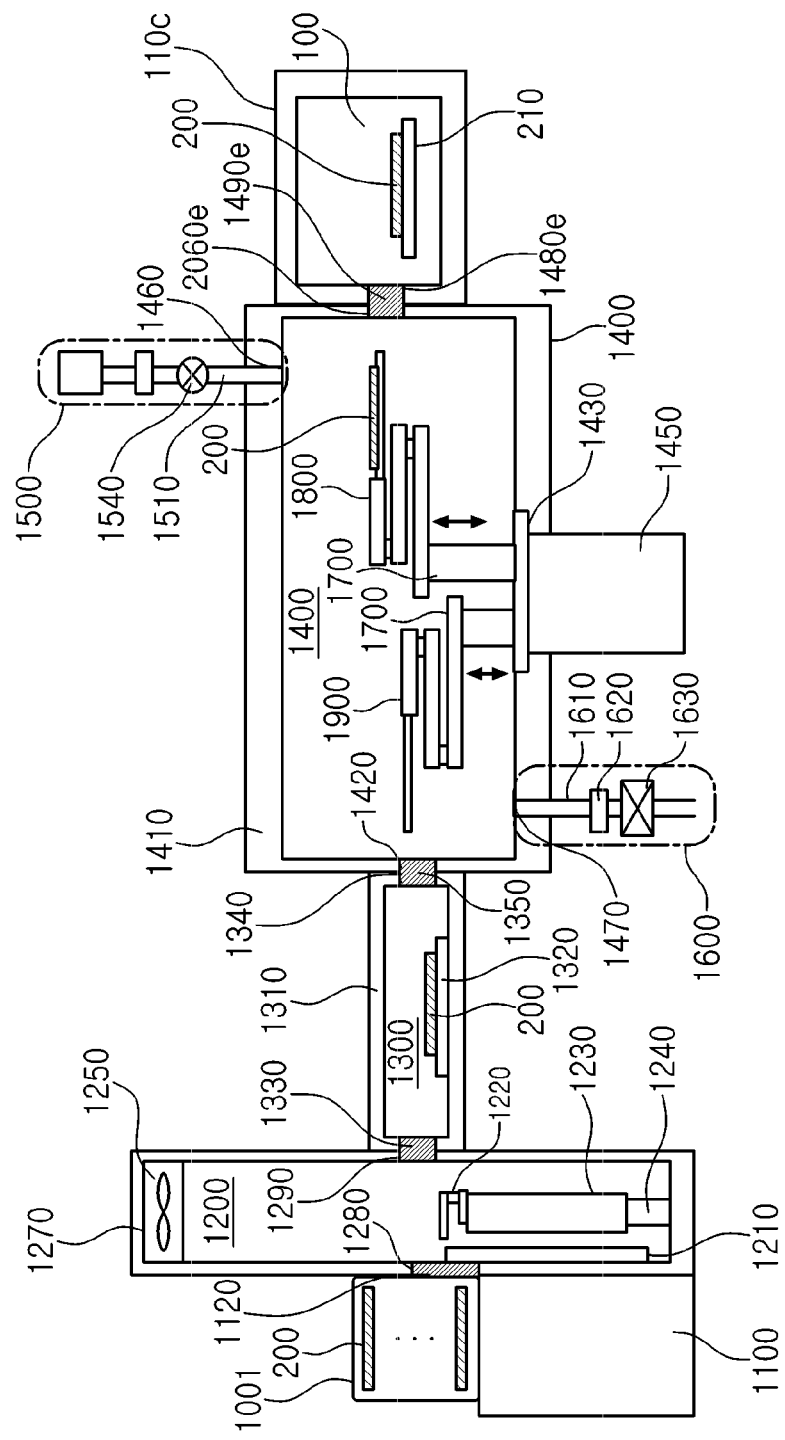
FIG. 2 schematically illustrates a vertical cross-section of the substrate processing system preferably used in the embodiment.
Figure 3:
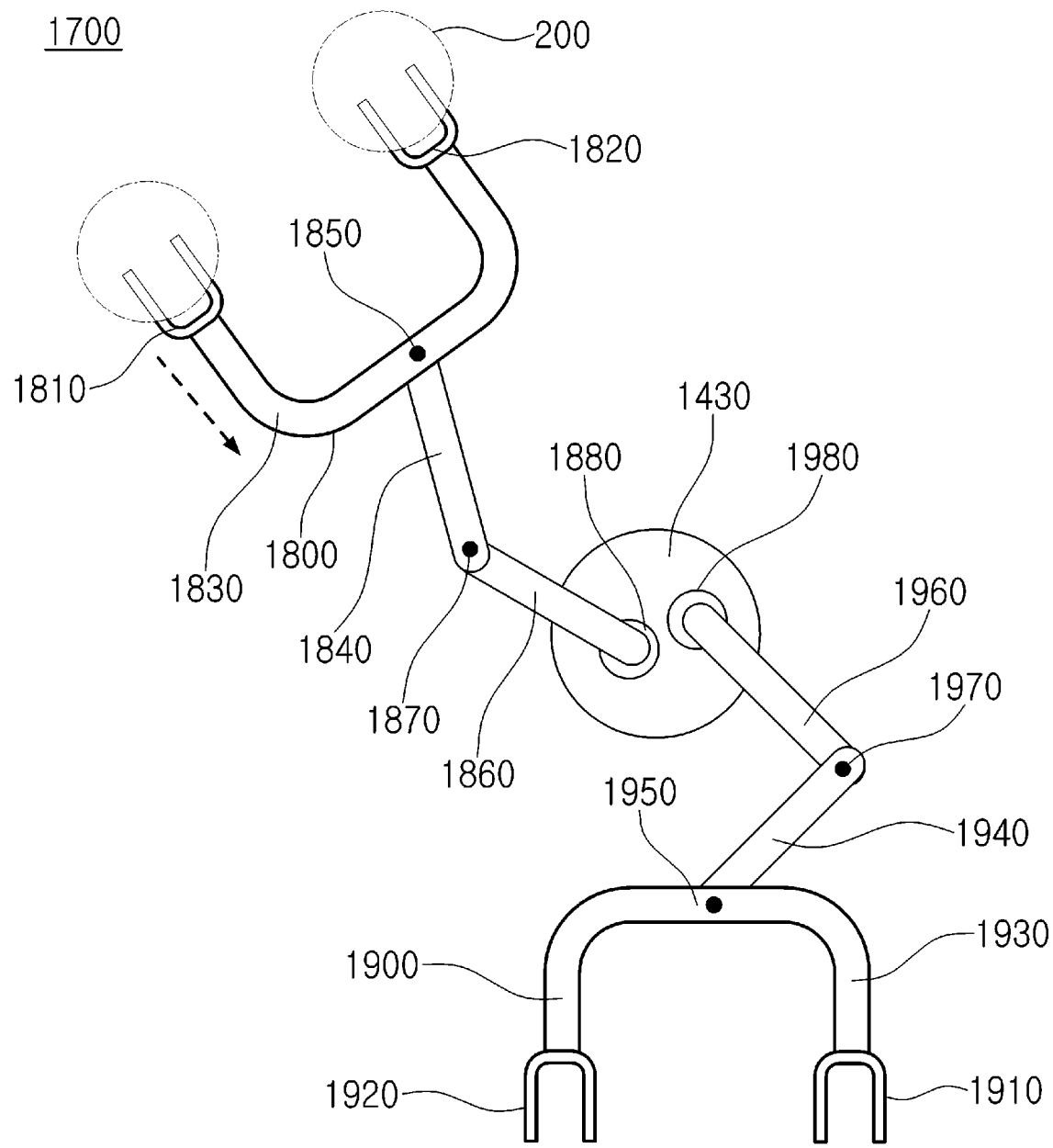
FIG. 3 schematically illustrates a vacuum transfer robot of the substrate processing system preferably used in the embodiment.
Figure 4:
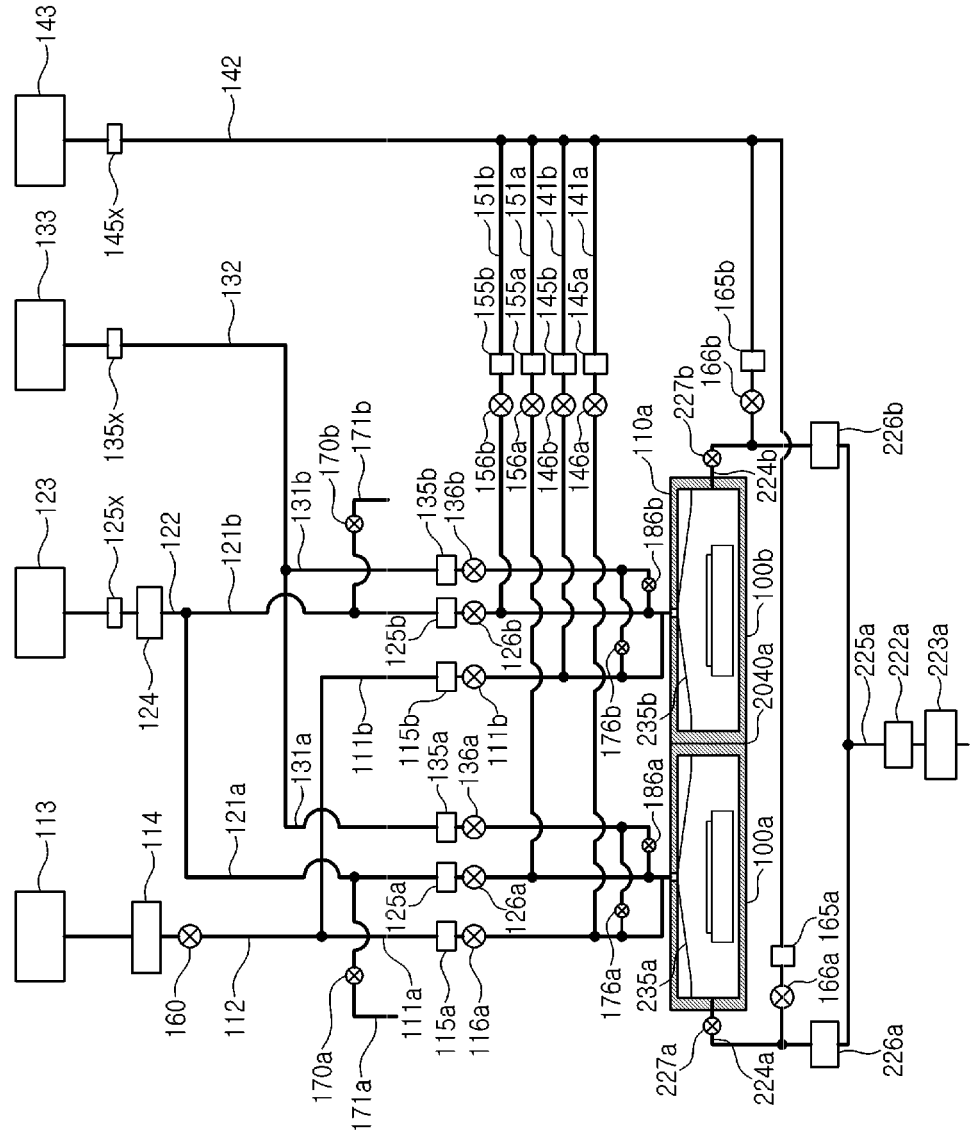
FIG. 4 schematically illustrates a gas supply system, a process module and a gas exhaust system of the substrate processing system preferably used in the embodiment.
Figure 5:
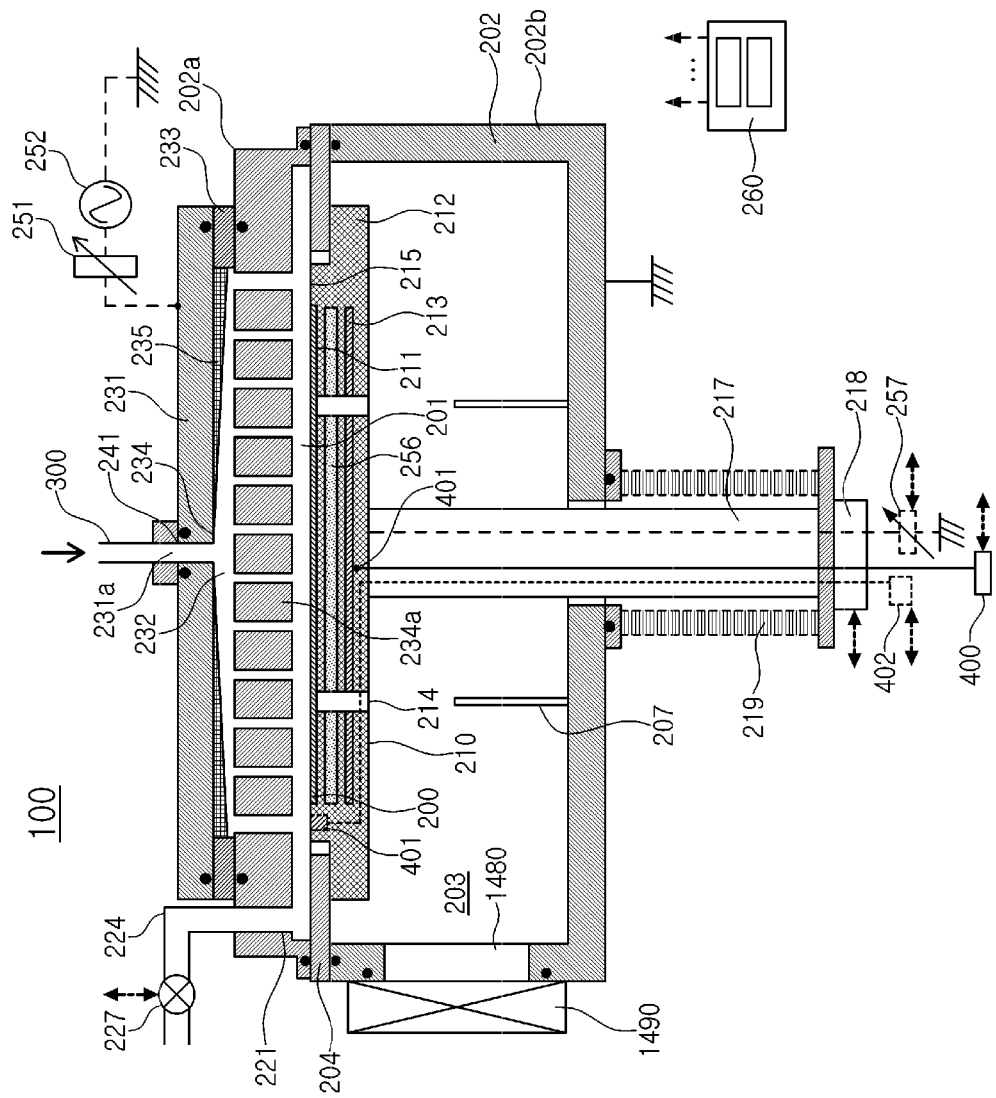
FIG. 5 schematically illustrates a vertical cross-section of a chamber of the substrate processing system preferably used in the embodiment.

The substrate processing system preferably used in the embodiment will be described with reference to FIGS. 1 through 4. FIG. 1 schematically illustrates a horizontal cross-section of the substrate processing system preferably used in the embodiment. FIG. 2 schematically illustrates a vertical cross-section of the substrate processing system taken along the line α-α' in FIG. 1. FIG. 3 schematically illustrates arms of a vacuum transfer robot of the substrate processing system preferably used in the embodiment. FIG. 4 schematically illustrates a vertical cross-section taken along the line β-β' of FIG. 1, and illustrates a gas supply system configured to supply gases into a process module (hereinafter, also referred to as a "PM") of the substrate processing system. FIG. 5 schematically illustrates a vertical cross-section of a chamber provided at the process module of the substrate processing system preferably used in the embodiment.

Referring to FIGS. 1 and 2, a substrate processing system 1000 according to the embodiment is configured to process substrates 200. The substrate processing system 1000 includes an I/O stage 1100, an atmospheric transfer chamber 1200, a load lock chamber 1300, a vacuum transfer chamber 1400 and process modules 110a, 110b, 110c and 110d. Next, the configurations of the substrate processing system 1000 will be described in detail. In FIG. 1, front, rear, left and right directions are indicated by arrow $Y_1$, arrow $Y_2$, arrow $X_2$ and arrow $X_1$, respectively. In the embodiment, semiconductor devices are formed on surfaces of the substrates 200 and a process of manufacturing the semiconductor devices is performed in the substrate processing system 1000. In the present specification, the semiconductor devices may include at least one of integrated circuits (ICs) and an electronic element (a resistance element, a coil element, a capacitor element and a semiconductor device). The semiconductor devices may further include a dummy film required during the manufacture of the semiconductor device.

Atmospheric Transfer Chamber and I/O Stage

The I/O stage 1100 is provided at a front side of the substrate processing system 1000. In the present specification, the IO stage 1100 may also be referred to as a "loading port shelf". The I/O stage 1100 is configured such that a plurality of pods 1001 is placed on the I/O stage 1100. The pod 1001 is used as a carrier for transferring the substrates 200 such as silicon (Si) substrates. A plurality of substrates 200 (also referred to as wafers) is accommodated in multiple stages in horizontal orientation in the pod 1001. For example, a maximum of 25 substrates 200 are accommodated in the pod 1001. The number of the substrates 200 accommodated in the pod 1001 is adjusted depending on the processing result of another substrate processing apparatus or types of the products. The number of the substrates 200 accommodated in the pod 1001 may be less than 25. For example, the number of the substrates 200 accommodated in the pod 1001 may be 24, 23, 22, 21 or less. As the number of the substrates 200 accommodated in the pod 1001 decreases, the frequency with which the pod 1001 is placed on the I/O stage 1100 also decreases. For example, the frequency that the pod 1001 accommodating 25 substrates 200 is placed on the I/O stage 1100 is greater than the frequency that the pod 1001 accommodating 24 substrates 200 is placed on the I/O stage 1100. Similarly, the frequency that the pod 1001 accommodating 24 substrates 200 is placed on the I/O stage 1100 is greater than the frequency that the pod 1001 accommodating 23 substrates 200 is placed on the I/O stage 1100.

A cap 1120 is installed at the pod 1001. The cap 1120 is opened or closed by a pod opener 1210 which will be described later. The pod opener 1210 is configured to open and close the cap 1120 of the pod 1001 placed on the I/O stage 1100. When the pod opener 1210 opens a substrate entrance (not shown) of the pod 1001, the substrates 200 may be loaded into or unloaded from the pod 1001. The pod 1001 is provided to or discharged from the I/O stage 1100 by an in-process transfer device (not shown) such as a rail guided vehicle (RGV).

The I/O stage 1100 is provided adjacent to the atmospheric transfer chamber 1200. The load lock chamber 1300, which will be described later, is connected to a side of the atmospheric transfer chamber 1200 other than the side at which the I/O stage 1100 is provided.

An atmospheric transfer robot 1220, which is a first transfer robot configured to transfer the substrates 200, is provided in the atmospheric transfer chamber 1200. As shown in FIG. 2, the atmospheric transfer robot 1220 is elevated or lowered by an elevator 1230 installed in the atmospheric transfer chamber 1200 and is reciprocated laterally by a linear actuator 1240.

As shown in FIG. 2, a clean air supply mechanism 1250 for supplying clean air is installed above the atmospheric transfer chamber 1200. As shown in FIG. 1, a device (hereinafter, also referred to as a "pre-aligner") 1260 configured to align a notch in the substrates 200 or an orientation flat is provided on a left side of the atmospheric transfer chamber 1200.

As shown in FIG. 1 and FIG. 2, a substrate loading/unloading port 1280 for transferring the substrates 200 into or out of the atmospheric transfer chamber 1200 and the pod opener 1210 are provided at a front side of a housing 1270 of the atmospheric transfer chamber 1200. The I/O stage (that it, the loading port shelf) 1100 is provided at the pod opener 1210 with the substrate loading/unloading port 1280 interposed therebetween. That is, the I/O Stage 1100 is provided outside the housing 1270.

A substrate loading/unloading port 1290 for transferring the substrates 200 into or out of the load lock chamber 1300 is provided at a rear side of the housing 1270 of the atmospheric transfer chamber 1200. The substrate loading/unloading port 1290 is opened or closed by a gate valve 1330 which will be described later. When the substrate loading/unloading port 1290 is opened by the gate valve 1330, the substrates 200 may be loaded into the load lock chamber 1300 or unloaded from the load lock chamber 1300.

Load Lock Chamber

The load lock chamber 1300 is provided adjacent to the atmospheric transfer chamber 1200. The vacuum transfer chamber 1400, which will be described later, is provided at a side of the housing 1310 constituting the load lock chamber 1300 other than the side of the housing 1310 that is adjacent to the atmospheric transfer chamber 1200. Since an inner pressure of the housing 1310 is adjusted to an inner pressure of the atmospheric transfer chamber 1200 or an inner pressure of the vacuum transfer chamber 1400, the load lock chamber 1300 is constructed to withstand a negative pressure.

A substrate loading/unloading port 1340 is provided at a side of the housing 1310 adjacent to the vacuum transfer chamber 1400. The substrate loading/unloading port 1340 is opened or closed by a gate valve 1350. When the substrate loading/unloading port 1340 is opened by the gate valve 1350, the substrates 200 may be loaded into the vacuum transfer chamber 1400 or unloaded from the vacuum transfer chamber 1400.

A substrate support 1320 having at least two placing surfaces 1311$a$ and 1311$b$ is provided in the load lock chamber 1300. The substrates 200 may be placed on the at least two placing surfaces 1311$a$ and 1311$b$. The distance between the at least two placing surfaces 1311$a$ and 1311$b$ is set based on the distance between end effectors of an arm of a vacuum transfer robot 1700 which will be described later.

Vacuum Transfer Chamber

The substrate processing system 1000 includes the vacuum transfer chamber (also referred to as a "transfer module") 1400, that is, a transfer space in which the substrates 200 are transferred under a negative pressure. A housing 1410 constituting the vacuum transfer chamber 1400 is pentagonal when viewed from above. The load lock chamber 1300 and the process modules (also referred to as "PMs") 110$a$, 110$b$, 110$c$ and 110$d$ where the substrates 200 are processed are connected to respective sides of the pentagonal housing 1410. The vacuum transfer robot 1700 capable of transferring the substrates 200 under the negative pressure is provided at approximately at the center of the vacuum transfer chamber 1400 with a flange 1430 as a base. Detection sensors 1401 are provided, for example, in the vicinity of the connecting portions with each of the PMs 110$a$ through 110$d$, and configured to detect the movement of the substrate 200 between the vacuum transfer chamber 1400 and each of the PMs 110$a$ through 110$d$. The detection sensors 1401 are configured to transmit the position data of the substrate 200 to a controller 260 described later. While the pentagonal vacuum transfer chamber 1400 is shown in FIG. 1, the vacuum transfer chamber 1400 may be polygonal such as rectangular and hexagonal. Preferably, the number of the process modules provided in the substrate processing system 1000 is an even number.

A substrate loading/unloading port 1420 is provided at a sidewall of the housing 1410 adjacent to the load lock chamber 1300. The substrate loading/unloading port 1420 is opened or closed by the gate valve 1350. The substrates 200 may be loaded into or unloaded from the vacuum transfer chamber 1400 through the substrate loading/unloading port 1420.

As shown in FIG. 2, the vacuum transfer robot 1700 provided in the vacuum transfer chamber 1400 may be elevated and lowered by an elevator 1450 while maintaining the vacuum transfer chamber 1400 airtight by the flange 1430. The vacuum transfer robot 1700 will be described later in detail. The elevator 1450 is configured to elevate and lower two arms 1800 and 1900 of the vacuum transfer robot 1700 independently.

An inert gas supply hole 1460 configured to supply an inert gas into the housing 1410 is provided at a ceiling portion of the housing 1410. An inert gas supply pipe 1510 is provided at the inert gas supply hole 1460. An inert gas source 1520, a mass flow controller (also referred to as an "MFC") 1530 and a valve 1540 are provided at the inert gas supply pipe 1510 in order from the upstream side to the downstream side of the inert gas supply pipe 1510 in order to supply the inert gas into the housing 1410 at a predetermined flow rate.

An inert gas supply system 1500 at the vacuum transfer chamber 1400 is mainly constituted by the inert gas supply pipe 1510, the MFC 1530 and the valve 1540. The inert gas supply system 1500 may further include the inert gas source 1520 and the inert gas supply hole 1460.

An exhaust port 1470 configured to exhaust an inner atmosphere of the housing 1410 is provided at the bottom of the housing 1410. An exhaust pipe 1610 is provided at the exhaust port 1470. An APC (automatic pressure controller) 1620 and a pump 1630 are provided at the exhaust pipe 1610 from an upstream side to a downstream side of the exhaust pipe 1610.

A gas exhaust system 1600 at the vacuum transfer chamber 1400 is mainly constituted by the exhaust pipe 1610 and the APC 1620. The gas exhaust system 1600 may further include the pump 1630 and the exhaust port 1470.

The atmosphere of the vacuum transfer chamber 1400 is controlled by the collaboration of the inert gas supply system 1500 and the gas exhaust system 1600. For example, an inner pressure of the housing 1410 is controlled.

As shown in FIG. 1, the process modules 110*a*, 110*b*, 110*c* and 110*d* where a desired processing is performed on the substrates 200 are connected to sidewalls of the housing 1410 other than the sidewall to which the load lock chamber 1300 is connected.

A plurality of chambers is provided in each of the process modules 110*a*, 110*b*, 110*c* and 110*d*. Specifically, the chambers 100*a* and 100*b* are provided in the process module 110*a*. The chambers 100*c* and 100*d* are provided in the process module 110*b*. The chambers 100*e* and 100*f* are provided in the process module 110*c*. The chambers 100*g* and 100*h* are provided in the process module 110*d*. Hereinafter, one of the chambers 100*a* through 100*h* may be referred to as a "chamber 100" or all of the chambers 100*a* through 100*h* may be collectively referred to as "chambers 100". Preferably, the number of the chambers provided in each of the process modules 110*a*, 110*b*, 110*c* and 110*d* is an even number.

Of the sidewalls of the housing 1410, substrate loading/unloading ports 1480*a* through 1480*h* are provided in the sidewalls facing each chamber 100. For example, as shown in FIG. 2, the substrate loading/unloading port 1480*e* is provided in the sidewall facing the chamber 100*e*. Hereinafter, one of the substrate loading/unloading ports 1480*a* through 1480*h* may be referred to as a "substrate loading/unloading port 1480" or all of the substrate loading/unloading ports 1480*a* through 1480*h* may be collectively referred to as "substrate loading/unloading ports 1480".

Similar to the substrate loading/unloading port 1480*e* and the chamber 100*e* shown in FIG. 2, the substrate loading/unloading port 1480*a* of FIG. 1 is provided in the sidewall facing the chamber 100*a*.

Similar to the substrate loading/unloading port 1480*e* and the chamber 100*e* shown in FIG. 2, the substrate loading/unloading port 1480*b* of FIG. 1 is provided in the sidewall facing the chamber 100*b*.

As shown in FIG. 1, gate valves (GVs) 1490*a* through 1490*h* provided at chambers 100*a* through 100*h*. Specifically, the gate valve 1490*a* is provided between the chamber 100*a* and the vacuum transfer chamber 1400. The gate valve 1490*b* is provided between the chamber 100*b* and the vacuum transfer chamber 1400. The gate valve 1490*c* is provided between the chamber 100*c* and the vacuum transfer chamber 1400. The gate valve 1490*d* is provided between the chamber 100*d* and the vacuum transfer chamber 1400. The gate valve 1490*e* is provided between the chamber 100*e* and the vacuum transfer chamber 1400. The gate valve 1490*f* is provided between the chamber 100*f* and the vacuum transfer chamber 1400. The gate valve 1490*g* is provided between the chamber 100*g* and the vacuum transfer chamber 1400. The gate valve 1490*h* is provided between the chamber 100*h* and the vacuum transfer chamber 1400. Hereinafter, one of the gate valves 1490*a* through 1490*h* may be referred to as "gate valve 1490" or all of the gate valves 1490*a* through 1490*h* may be collectively referred to as "gate valves 1490".

Each of the gate valves 1490 is configured to open or close the substrate loading/unloading ports 1480. The substrates 200 are transferred into or out of the chambers 100 through each of the substrate loading/unloading ports 1480.

Vacuum Transfer Robot

Next, the vacuum transfer robot 1700 (also referred to as a "transfer mechanism") provided in the vacuum transfer chamber 1400 will be described with reference to FIG. 3. FIG. 3 is an enlarged view of the vacuum transfer robot 1700 of FIG. 1.

The vacuum transfer robot 1700 has two arms 1800 and 1900. The arm 1800 includes a fork portion 1830 having two end effectors 1810 and 1820 at the tip (front end) thereof. A middle portion 1840 is connected to a center of the fork portion 1830 through a shaft 1850. A combination of two end effectors and one fork portion is referred to as a "supporting portion". The vacuum transfer robot 1700 includes at least one supporting portion. The supporting portion of the vacuum transfer robot 1700 is configured to support two substrates 200.

The substrates 200 unloaded from each of the process modules 110*a* through 110*d* are placed on the end effectors 1810 and 1820. In FIG. 2, for example, the substrate 200 unloaded from the process module 110*c* is placed on the end effector of the arm 1800.

A bottom portion 1860 is connected to the middle portion 1840 via a shaft 1870 at a position different from where the fork portion 1830 is connected. The bottom portion 1860 is disposed on the flange 1430 via a shaft 1880.

The arm 1900 includes a fork portion 1930 having two end effectors 1910 and 1920 at the tip (front end) thereof. A middle portion 18940 is connected to a center of the fork portion 1930 through a shaft 1850.

The substrates 200 unloaded from the load lock chamber 1300 are placed on the end effectors 1910 and 1920.

A bottom portion 1960 is connected to the middle portion 1940 via a shaft 1970 at a position different from where the fork portion 1930 is connected. The bottom portion 1960 is disposed on the flange 1430 via a shaft 1980.

The end effector 1810 and the end effector 1820 are disposed higher than the end effector 1910 and the end effector 1920.

It is possible to rotate the vacuum transfer robot 1700 about an axis, and extend the arms 1800 and 1900 of the vacuum transfer robot 1700.

In addition, for example, the vacuum transfer robot 1700 is configured to transfer the substrate 200 placed on the placing surface 1311a to one of the chamber 100a, the chamber 100c, the chamber 100e and the chamber 100g, and to transfer the substrate 200 placed on the placing surface 1311b to one of the chamber 100b, the chamber 100d, the chamber 100f and the chamber 100h.

Process Modules (PM)

Next, the process module 110a among the process modules (process mechanisms) 110a through 110d will be described with reference to FIGS. 1, 2 and 4 as an example. In FIG. 4, the process module 110a, a gas supply system connected to the process module 110a and a gas exhaust system connected to the process module 110a are schematically illustrated.

While the process module 110a is exemplified, the other process modules including the process module 110b, the process module 110c and the process module 110d are the same as the process module 110a. Accordingly, the descriptions of the process modules 110b, 110c and 110d are omitted.

As shown in FIG. 4, the process module 110a includes two chambers where the substrates 200 are processed, that is, the chamber 100a and the chamber 100b. A partition wall 2040a is provided between the chamber 100a and the chamber 100b. The partition wall 2040a is configured to prevent mixing of inner atmospheres of the chamber 100a and the chamber 100b.

As shown in FIGS. 1 and 2, a substrate loading/unloading port 2060e is provided in the sidewall of the vacuum transfer chamber 1400 adjacent to the chamber 100e. Similarly, a substrate loading/unloading port 2060a is provided in the sidewall of the vacuum transfer chamber 1400 adjacent to the chamber 100a.

A substrate support part 210 configured to support the substrate 200 is provided in the chambers 100a through 100h, respectively.

A gas supply system configured to supply gases including a process gas to each of the chamber 100a and the chamber 100b is connected to the process module 110a. The gas supply system includes at least one of a first gas supply system (process gas supply system), a second gas supply system (reactive gas supply system), a third gas supply system (first purge gas supply system, and a fourth gas supply system (second purge gas supply system). The detailed configuration of the first through fourth gas supply systems will be described.

First Gas Supply System

As shown in FIG. 4, a buffer tank 114, a tank side valve 160, mass flow controllers (MFCs) 115a and 115b and process chamber side valves 116a and 116b are provided between a process gas source 113 and the process module 110a. Specifically, the buffer tank 114 and the tank side valve 160 are connected to a process gas common pipe 112. The MFC 115a and the process chamber side valve 116a are connected to a first gas supply pipe (process gas supply pipe) 111a, and the MFC 115b and the process chamber side valve 116b are connected to a first gas supply pipe (process gas supply pipe) 111b. The process gas supplied from the process gas source 113 is supplied to the chambers 100a and 100b via the process gas common pipe 112, the first gas supply pipes (process gas supply pipes) 111a and 111b and the common gas supply pipe 300 shown in FIG. 5. Hereinafter, the chamber 100 is also referred to as a substrate processing apparatus 100. The first gas supply system is constituted by the MFCs 115a and 115b, the process chamber side valves 116a and 116b, the process gas common pipe 112 and the first gas supply pipes (process gas supply pipes) 111a and 111b. The first gas supply system may further include at least one of the process gas source 113 and the buffer tank 114. The same components described at the first gas supply system may be added or removed according to the number of the process modules (PMs) installed in the substrate processing system 1000.

Second Gas Supply System

As shown in FIG. 4, a remote plasma unit (RPU) 124 serving as an activation mechanism, mass flow controllers (MFCs) 125a and 125b and process chamber side valves 126a and 126b are provided between a reactive gas source 123 and the process module 110a. Specifically, the remote plasma unit (RPU) 124 is connected to a reactive gas common pipe 122. The MFC 125a and the process chamber side valve 126a are connected to a second gas supply pipe (reactive gas supply pipe) 121a, and the MFC 125b and the process chamber side valve 126b are connected to a second gas supply pipe (reactive gas supply pipe) 121b. A reactive gas supplied from the reactive gas source 123 is supplied to the substrate processing apparatus 100 via the reactive gas common pipe 122, the second gas supply pipes (reactive gas supply pipes) 121a and 121b and a common gas supply pipe 300 shown in FIG. 5. The second gas supply system is constituted by the RPU 124, the MFCs 125a and 125b, the process chamber side valves 126a and 126b, the reactive gas common pipe 122 and the second gas supply pipes (reactive gas supply pipes) 121a and 121b. The first gas supply system may further include the reactive gas source 123. The same components described at the second gas supply system may be added or removed according to the number of the process modules (PMs) installed in the substrate processing system 1000.

In addition, vent lines 171a and 171b and vent valves 170a and 170b may be provided in front of the process chamber side valves 126a and 126b and may be configured to exhaust the reactive gas. When the vent lines 171a and 171b are installed, the reactive gas deactivated or the reactive gas having reduced reactivity may be discharged without passing through the process chamber, that is, the chamber 100.

Third Gas Supply System (First Purge Gas Supply System)

As shown in FIG. 4, mass flow controllers (MFCs) 135a and 135b and process chamber side valves 136a and 136b, valves 176a, 176b, 186a and 186b are provided between a first purge gas source (inert gas source) 133 and the process module 110a. Specifically, the first purge gas source (inert gas source) 133 is connected to a purge gas common pipe (inert gas common pipe) 132. The MFC 135a and the process chamber side valve 136a are connected to a purge gas supply pipe (inert gas supply pipe) 131a, and the MFC 135b and the process chamber side valve 136b are connected to a purge gas supply pipe (inert gas supply pipe) 131b. A purge gas (inert gas) supplied from the first purge gas source 133 is supplied to the substrate processing apparatus 100 via the purge gas common pipe (inert gas common pipe) 132, the purge gas supply pipes (inert gas supply pipes) 131a and 131b and the common gas supply pipe 300 shown in FIG. 5. The third gas supply system is constituted by the MFCs 135a and 135b, the process chamber side valves 136a and 136b, the purge gas common pipe (inert gas common pipe) 132 and the purge gas supply pipes (inert gas supply pipes) 131a and 131b. The third gas supply system (first purge gas supply system) may further include the first purge gas source (inert gas source) 133. The same components described at the third gas supply system may be added or removed according to the number of the process modules (PMs) installed in the substrate processing system 1000.

Fourth Gas Supply System (Second Purge Gas Supply System)

As shown in FIG. 4, the fourth gas supply system is configured to supply an inert gas to the process chambers 110a and 110b through the process gas supply pipes 111a and 111b and the reactive gas supply pipes 121a and 121b. Second purge gas supply pipes 141a, 141b, 151a and 151b, mass flow controllers (MFCs) 145a, 145b, 155a and 155b and valves 146a, 146b, 156a and 156b are provided between a second purge gas source (inert gas source) 143 and the gas supply pipes 111a, 111b, 121a and 121b. The fourth gas supply system (second purge gas supply system) is constituted by these components. Although the inert gas sources of the third gas supply system and the fourth gas supply system are separately configured in the embodiment, only one integrated inert gas source may be provided.

Each of the MFCs provided in the first through fourth gas supply systems is configured to transmit and receive a flow rate value (flow rate data) to and from the controller 260 described later. In addition, each of the valves described above is configured to transmit and receive a valve opening degree value (valve opening degree data) to and from the controller 260 described later.

A gas exhaust system configured to exhaust the inner atmosphere of the chamber 100a and the inner atmosphere of the chamber 100b, respectively, is connected to the process module 110a. As shown in FIG. 4, an APC (automatic pressure controller) 222a, a common gas exhaust pipe 225a and process chamber exhaust pipes 224a and 224b are provided between an exhaust pump 223a and the chambers 100a and 100b. The gas exhaust system is constituted by the APC 222a, the common gas exhaust pipe 225a and the process chamber exhaust pipes 224a and 224b. The inner atmospheres of the chambers 100a and the chamber 100b are configured to be exhausted by a single exhaust pump, that is, the exhaust pump 223a. In addition, conductance adjusting mechanisms 226a and 226b configured to adjust an exhaust conductance of each of the process chamber exhaust pipes 224a and 224b, respectively, may be provided. The gas exhaust system may further include the conductance adjusting mechanisms 226a and 226b. The gas exhaust system may further include the exhaust pump 223a. In addition, the APC 222a and the conductance adjusting mechanisms 226a and 226b are configured to transmit and receive a valve opening degree value (valve opening degree data) or a pressure value (pressure data) to and from the controller 260 described later.

Next, the chamber 100 according to the embodiment will be described. The chamber 100 is configured as a single substrate processing apparatus as shown in FIG. 5. A process for manufacturing a semiconductor device is performed in the chamber 100. Also, the chambers 100a, 100b, 100c, 100d, 100e, 100f, 100g and 100h are configured to have the same configuration as shown in FIG. 5. Hereinafter, the chamber 100a will be described as an example.

As shown in FIG. 5, the chamber 100 includes a process vessel 202. The process vessel 202 includes, for example, a flat, sealed vessel having a circular horizontal cross-section. The process vessel 202 is made of a metal material such as aluminum (Al) and stainless steel (SUS) or quartz. A process chamber (processing space) 201 where the substrate 200 such as a silicon wafer as a substrate is processed and a transfer chamber (transfer space) 203 are provided in the process vessel 202. The process vessel 202 includes an upper vessel 202a and a lower vessel 202b. A partition plate 204 is provided between the upper vessel 202a and the lower vessel 202b. A space above the partition plate 204 surrounded by the upper vessel 202a is referred to as the process chamber (processing space) 201 and a space below the partition plate 204 surrounded by the lower vessel 202b is referred to as the transfer chamber (transfer space) 203.

The substrate loading/unloading port 1480 is provided adjacent to the gate valve 1490 at a side of the lower vessel 202b. The substrate 200 is transferred between the transfer chamber 203 and the vacuum transfer chamber 1400 through the substrate loading/unloading port 1480. Lift pins 207 are provided at the bottom of the lower vessel 202b. The lower vessel 202b is electrically grounded.

The substrate support part 210 configured to support the substrate 200 is provided in the process chamber 201. The substrate support part 210 includes a substrate support 212 having a substrate placing surface 211 where the substrate 200 is placed and an outer peripheral surface 215 provided at an outer peripheral side of the substrate placing surface 211. With the outer peripheral surface 215, it is possible to make an amount of the gas supplied to an outer peripheral side of the substrate 200 close to an amount of the gas supplied to a center side of the substrate 200. Preferably, the substrate support part 210 may further include a heater 213 which is a heating mechanism. When the substrate support part 210 further includes the heater 213, the substrate 200 may be heated by the heater 213. As a result, it is possible to improve the quality of a film formed on the substrate 200. In addition, the heater 213 is connected to a temperature controller 400. The temperature of the heater 213 is controlled by the temperature controller 400. The temperature controller 400 is configured to transmit and receive a temperature value (temperature data) to and from the controller 260 described later via a signal line. Through-holes 214 through which the lift pins 207 penetrate are provided at positions of the substrate support 212 corresponding to the lift pins 207. A bias electrode 256 configured to apply a bias to the substrate 200 or the process chamber 201 may be provided in the substrate support 212. The bias electrode 256 is electrically connected to a bias controller 257. The bias controller 257 is configured to adjust the bias. The bias controller 257 is configured to transmit and receive a bias value (bias data) to and from the controller 260 described later via a signal line. A film thickness monitor 401 configured to measure a thickness of the film formed on the substrate 200 may be provided at the substrate support 212. The film thickness monitor 401 is connected to a film thickness meter 402 via a signal line. The film thickness meter 402 is configured to generate a film thickness value (film thickness data). The film thickness meter 402 is further configured to transmit and receive the film thickness value (film thickness data) to and from the controller 260 described later via a signal line.

The substrate support 212 is supported by a shaft 217. The shaft 217 penetrates the bottom of the process vessel 202 and is connected to an elevating mechanism 218 at the outside of the process vessel 202. The substrate 200 placed on the substrate placing surface 211 of the substrate support 212 may be elevated and lowered by operating the elevating mechanism 218 by elevating and lowering the shaft 217 and the substrate support 212. A bellows 219 covers a lower end portion of the shaft 217 to maintain the process chamber 201 airtight. The elevating mechanism 218 is configured to transmit and receive height data of the substrate support 212 to and from the controller 260 described later via a signal line.

When the substrate 200 is transferred, the substrate support 212 is lowered until the substrate placing surface 211 faces the substrate loading/unloading port 1480, that is, until a wafer transfer position is reached. When the substrate 200 is processed, the substrate support 212 is elevated until the substrate 200 reaches a processing position (wafer processing position) in the process chamber 201 as shown FIG. 5.

Specifically, when the substrate support 212 is lowered to the wafer transfer position, upper end portions of the lift pins 207 protrude from an upper surface of the substrate placing surface 211, and the lift pins 207 support the substrate 200 from thereunder. When the substrate support 212 is elevated to the wafer processing position, the lift pins 207 are buried from the upper surface of the substrate placing surface 211 and the substrate placing surface 211 supports the substrate 200 from thereunder. Since the lift pins 207 are in direct contact with the substrate 200, the lift pins 207 are preferably made of a material such as quartz and alumina. An elevation mechanism (not shown) may also be provided at the lift pins 207. The elevation mechanism (not shown) allows the substrate support 212 and lift pins 207 to move relatively.

Exhaust System

An exhaust port 221, which is a part of a first exhaust system for exhausting an inner atmosphere of the process chamber 201, is connected to an inner wall of the process chamber 201 (the upper vessel 202a). A process chamber exhaust pipe 224 and a valve 227 are connected to the exhaust port 221 in order. A first exhaust system (first exhaust line) 220 is mainly constituted by the exhaust port 221 and the process chamber exhaust pipe 224. The first exhaust system (first exhaust line) 220 may further include the valve 227. The valve 227 may be embodied by an APC (Automatic Pressure Controller) serving as a pressure controller. In addition, the valve 227 is configured to transmit and receive a valve opening degree value (valve opening degree data) to and from the controller 260 described later.

Gas Introduction Port

A gas introduction port 241 for supplying various gases into the process chamber 201 is provided at an upper surface (ceiling) of the upper vessel 202a. The common gas supply pipe 300 is connected to the gas introduction port 241. A shower head 234 serving as a gas dispersion mechanism is provided at a lower portion of the gas introduction port 241.

Gas Dispersion Mechanism

The shower head 234 includes a buffer chamber (buffer space) 232 and a dispersion plate 234a having a plurality of holes. The shower head 234 is provided between the gas introduction port 241 and the process chamber 201. The gas introduced through the gas introduction port 241 is supplied into the buffer space 232 of the shower head 234. The shower head 234 is made of a material such as quartz, alumina, stainless steel and aluminum.

A cover 231 of the shower head 234 may be made of a conductive metal. The cover 231 made of the conductive metal may serve as an activation mechanism (excitation mechanism) for exciting the gas present in at least one of the buffer space 232 and the process chamber 201. When the cover 231 serves as the activation mechanism, an insulating block 233 is provided between the cover 231 and the upper vessel 202a. The insulating block 233 insulates the cover 231 from the upper vessel 202a. A matching mechanism 251 and a high frequency power supply 252 may be connected to an electrode (cover 231) serving as the activation mechanism to supply an electromagnetic wave (high frequency power or microwave) to the electrode (cover 231). The high frequency power supply 252 is configured to transmit and receive values (data) such as a supplied power value (supplied power data) and a reflected power value (reflected power data) to and from the controller 260 described later.

A gas guide 235 may be provided to form a flow of the gas supplied to the buffer space 232. The gas guide 235 has a conic shape around a hole 231a. The diameter of the gas guide 235 increases along the direction from the center to the edge of the substrate 200.

Gas Supply System

The gas supply systems described above, for example, the first through fourth gas supply systems are connected to the gas introduction port 241 connected to the cover 231 of the shower head 234. The process gas, the reactive gas and the purge gas are supplied via the first through fourth gas supply systems, respectively.

Controller

As shown in FIGS. 1 and 5, the substrate processing system 1000 includes the controller 260 configured to control the operation of components of the substrate processing system 1000. For example, the controller 260 is configured to control the operation of components of the chamber 100.

Figure 6:
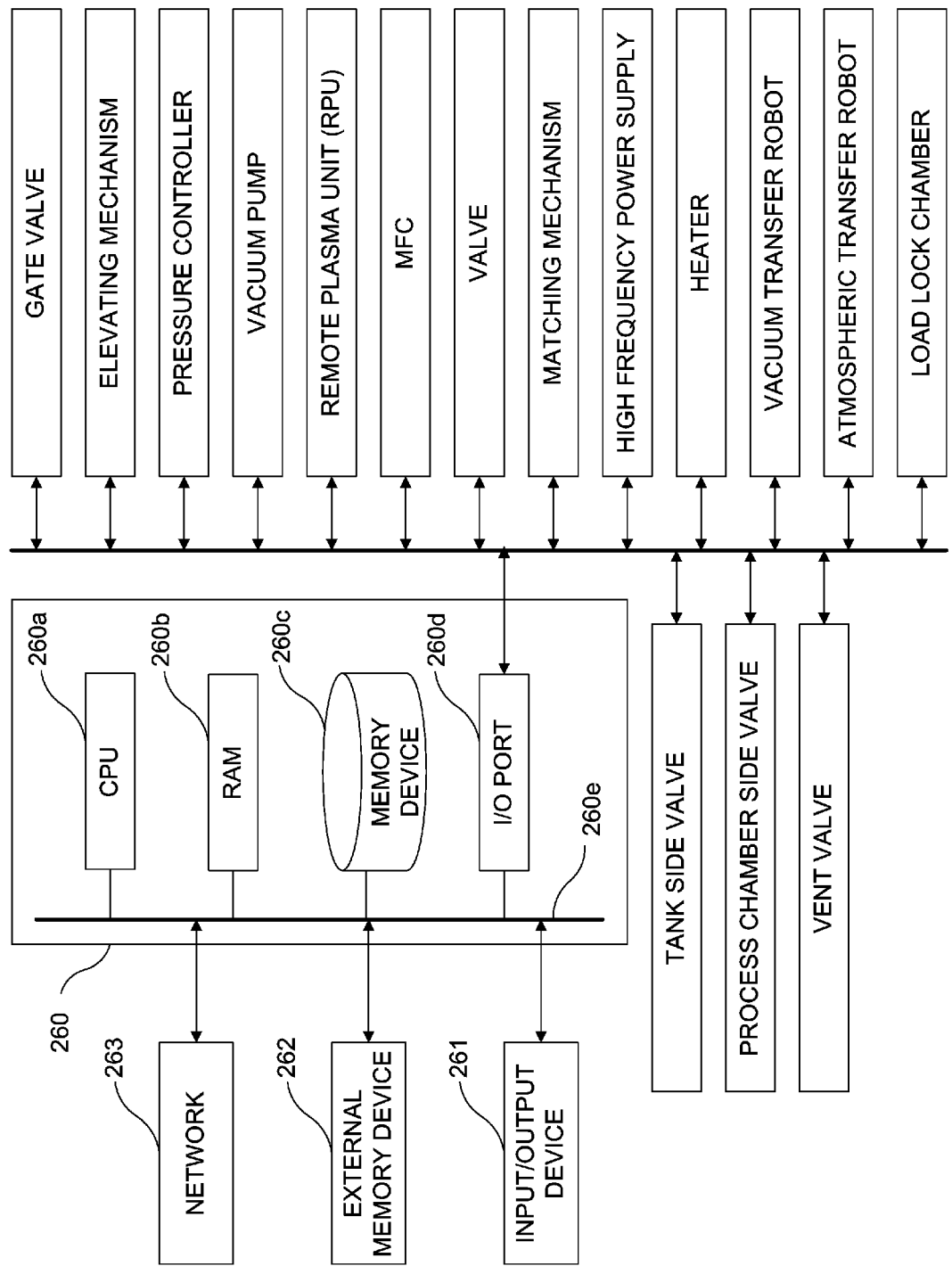
FIG. 6 schematically illustrates a configuration of a controller of the substrate processing system and peripherals thereof preferably used in the embodiment.

FIG. 6 is a block diagram schematically illustrating a configuration of the controller 260 and components connected to the controller 260 or controlled by the controller 260. The controller 260, which is a control device (control mechanism), may be embodied by a computer having a CPU (Central Processing Unit) 260a, a RAM (Random Access Memory) 260b, a memory device 260c and an I/O port 260d. The RAM 260b, the memory device 260c and the I/O port 260d may exchange data with the CPU 260a via an internal bus 260e. An input/output device 261 such as a touch panel and an external memory device 262 may be additionally connected to the controller 260.

The memory device 260c may be embodied by a component such as a flash memory and a HDD (Hard Disk Drive). For example, a control program for controlling the operation of the substrate processing apparatus 100 and a process recipe in which information such as the sequences and the conditions of a substrate processing described later is stored are readably stored in the memory device 260c. The process recipe is a program that is executed by the controller 260 to obtain a predetermined result by performing the sequences of the substrate processing. Hereinafter, the process recipe and the control program may be collectively referred to simply as "program." In the present specification, the term "program" may refer to only the process recipe, only the control program, or both. The RAM 260b is a work area in which the program or the data read by the CPU 260a are temporarily stored.

The I/O port 260d is electrically connected to the components such as the gate valves 1330, 1350 and 1490, the elevating mechanism 218, the heater 213, the APC (automatic pressure controller) 222a, the vacuum pump 223, the matching mechanism 251 and the high frequency power supply 252. In addition, the I/O port 260d may be electrically connected to the vacuum transfer robot 1700, the atmospheric transfer robot 1220 and the load lock chamber 1300. The I/O port 260*d* may be electrically connected to components of the process module 110*a* shown in FIG. 5 such as the MFCs 115*a*, 115*b*, 125*a*, 125*b*, 135*a*, 135*b*, 145*a*, 145*b*, 155*a*, 155*b*, 165*a*, 165*b* and 1530, the valve 227 (227*a*, 227*b*), the process chamber side valves 116*a*, 116*b*, 126*a*, 126*b*, 136*a*, 136*b*, 176*a*, 176*b*, 186*a* and 186*b*, the tank side valve 160, the vent valves 170*a* and 170*b* and the RPU 124. In addition, the I/O port 260*d* may be electrically connected to components of the other process modules 110*b*, 110*c* and 110*d* such as the MFCs (not shown), the valves (not shown), the process chamber side valves (not shown), the tank side valves (not shown), the vent valves (not shown) and the RPUs (not shown). In the present specification, "electrically connected" means that the components are connected by physical cables or the components are in communication with one another to transmit and receive data (signals) to and from one another directly or indirectly. For example, a device for relaying the signals or a device for converting or computing the signals may be provided between the components.

The CPU 260*a* is configured to read and execute the control program from the memory device 260*c* and read the process recipe in accordance with an instruction such as an operation command inputted from the input/output device 261. The CPU 260*a* is configured to control operations according to the process recipe such as opening and closing operations of the gate valves 1330, 1350 and 1490 (1490*a*, 1490*b*, 1490*c*, 1490*d*, 1490*e*, 1490*f*, 1490*g* and 1490*h*), an elevating and lowering operation of the elevating mechanism 218, an operation of supplying electrical power to the heater 213, a pressure adjusting operation of the APC 222*a*, an ON/OFF control operation of the vacuum pump 223, a gas activation operation of the RPU 124, flow rate adjusting operations by the MFCs 115*a*, 115*b*, 125*a*, 125*b*, 135*a*, 135*b*, 145*a*, 145*b*, 155*a*, 155*b*, 165*a*, 165*b* and 1530, ON/OFF control operations of the gas by the valve 227 (227*a*, 227*b*), the process chamber side valves 116*a*, 116*b*, 126*a*, 126*b*, 136*a*, 136*b*, 176*a*, 176*b*, 186*a* and 186*b*, the tank side valve 160 and the vent valves 170*a* and 170*b*, a power matching operation of the matching mechanism 251, and an on/off control operation of the high frequency power supply 252. In addition, the CPU 260*a* may be configured to control operations according to the process recipe such as operations of the components of the other process modules 110*b*, 110*c* and 110*d* described above.

The controller 260 is not limited to a dedicated computer. The controller 260 may be embodied by a general-purpose computer. The controller 260 according to the embodiment may be embodied by preparing the external memory device 262 (e.g., a magnetic tape, a magnetic disk such as a flexible disk and a hard disk, an optical disk such as a CD and a DVD, a magneto-optical disk such as an MO, a semiconductor memory such as a USB memory and a memory card), and installing the program onto the general-purpose computer using the external memory device 262. The method of providing the program to the computer is not limited to the external memory device 262. The program may be directly provided to the computer by a communication means such as a network 263 (Internet and a dedicated line) instead of the external memory device 262. The memory device 260*c* and the external memory device 262 may be embodied by a computer-readable recording medium. Hereafter, the memory device 260*c* and the external memory device 262 are collectively referred to as recording media. In the present specification, "recording media" may refer to only the memory device 260*c*, only the external memory device 262, or both.

(2) First Substrate Processing

Hereinafter, as an example of a semiconductor device manufacturing process, exemplary sequences of forming an insulating film, for example, a silicon oxide (SiO) film serving as a silicon-containing film, on the substrate 200 using the above-described substrate processing apparatus (for example, the chamber 100*a*) will be described with reference to FIGS. 7 and 8. Hereinafter, the controller 260 controls the operations of the components of the substrate processing apparatus.

In the present specification, the term "substrate" is substantially the same as the term "wafer." That is, the term "substrate" may be substituted by "wafer" and vice versa.

Next, a first substrate processing is described in detail.
Substrate Loading Step S201

First, in order to perform the first substrate processing, the substrate 200 is loaded into the process chamber 201. Specifically, the substrate support part 210 is lowered by the elevating mechanism 218, and the lift pins 207 protrude from the upper surface of the substrate support part 210 through the through-holes 214. After the inner pressure of the process chamber 201 is adjusted, the gate valve 1490 is opened. The substrate 200 is placed on the lift pins 207 through the gate valve 1490. After the substrate 200 is placed on the lift pins 207, the substrate support part 210 is elevated to a predetermined position by the elevating mechanism 218 so that the substrate 200 is placed on the substrate support part 210 from the lift pins 207.

Depressurization and Temperature Elevating Step S202

Next, the process chamber 201 is exhausted through the process chamber exhaust pipe 224 until the inner pressure of the process chamber 201 reaches a predetermined level (vacuum level). In the depressurization and temperature elevating step S202, the opening degree of the APC 222*a* serving as a pressure controller is feedback-controlled based on the pressure measured by a pressure sensor (not shown). The amount of current applied to the heater 213 is feedback-controlled based on the temperature value detected by a temperature sensor (not shown) until the temperature of the process chamber 201 reaches a predetermined temperature. Specifically, the substrate support part 210 is heated in advance by the heater 213, and the substrate 200 is heated to a predetermined temperature by the heated substrate support part 210. The heater 213 may heat the substrate support part 210 until the temperature of the substrate 200 or the temperature of the substrate support part 210 is stable. When gas from members or moisture is present in the process chamber 201, the gas or the moisture may be removed by vacuum-exhaust or purged with $N_2$ gas. The pre-processing step before a film-forming process is now complete. It is preferable that the process chamber 201 is exhausted to a vacuum level that can be reached by the vacuum pump 223 at once.

Film-Forming Step S210

Next, the film-forming step S210 will be described in detail. As the film-forming step S210, an example of forming the silicon oxide (SiO) film on the substrate 200 will be described with reference to FIGS. 7 and 8.

Figure 7:
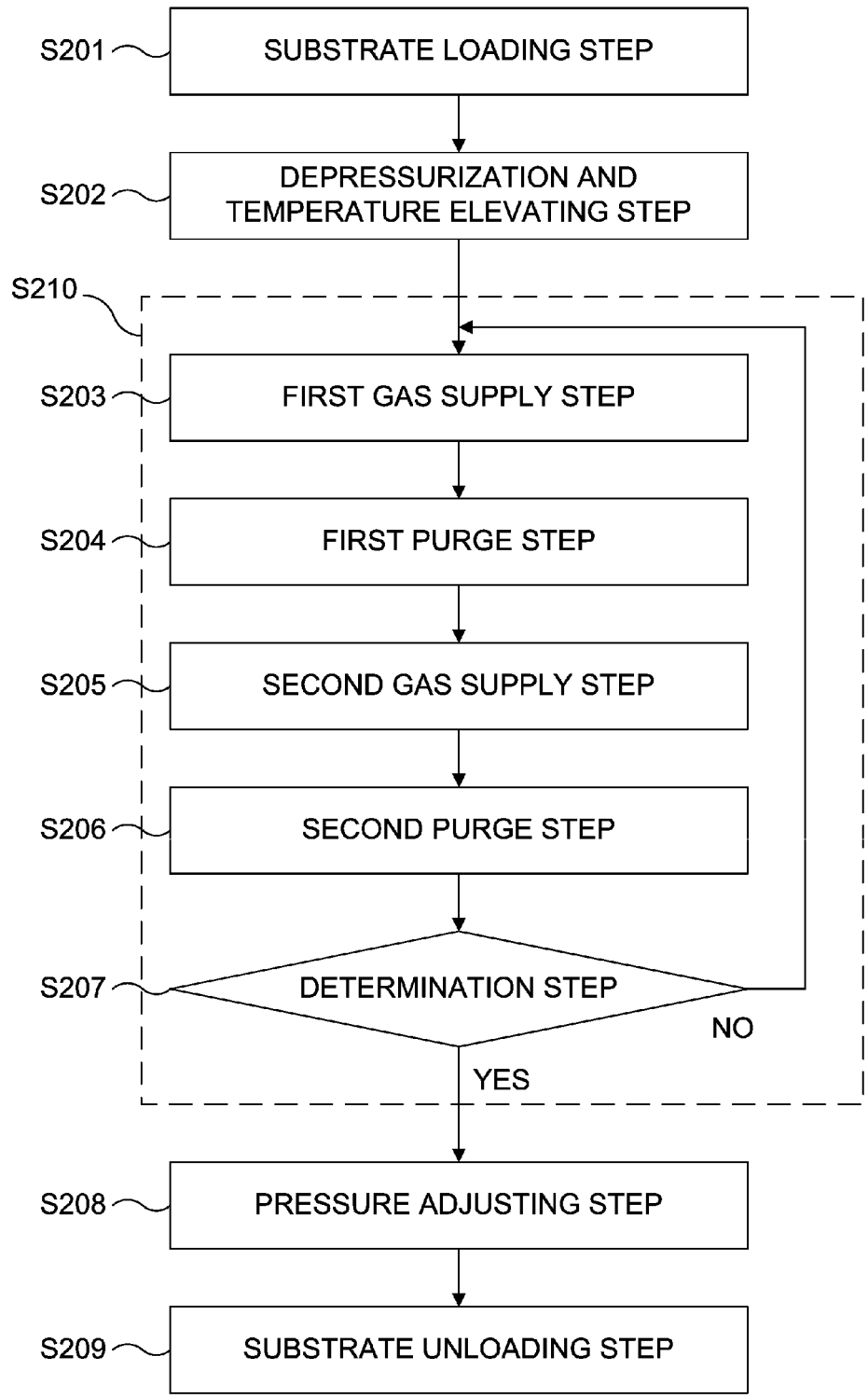
FIG. 7 is a flowchart illustrating a first substrate processing according to the embodiment.
Figure 8:
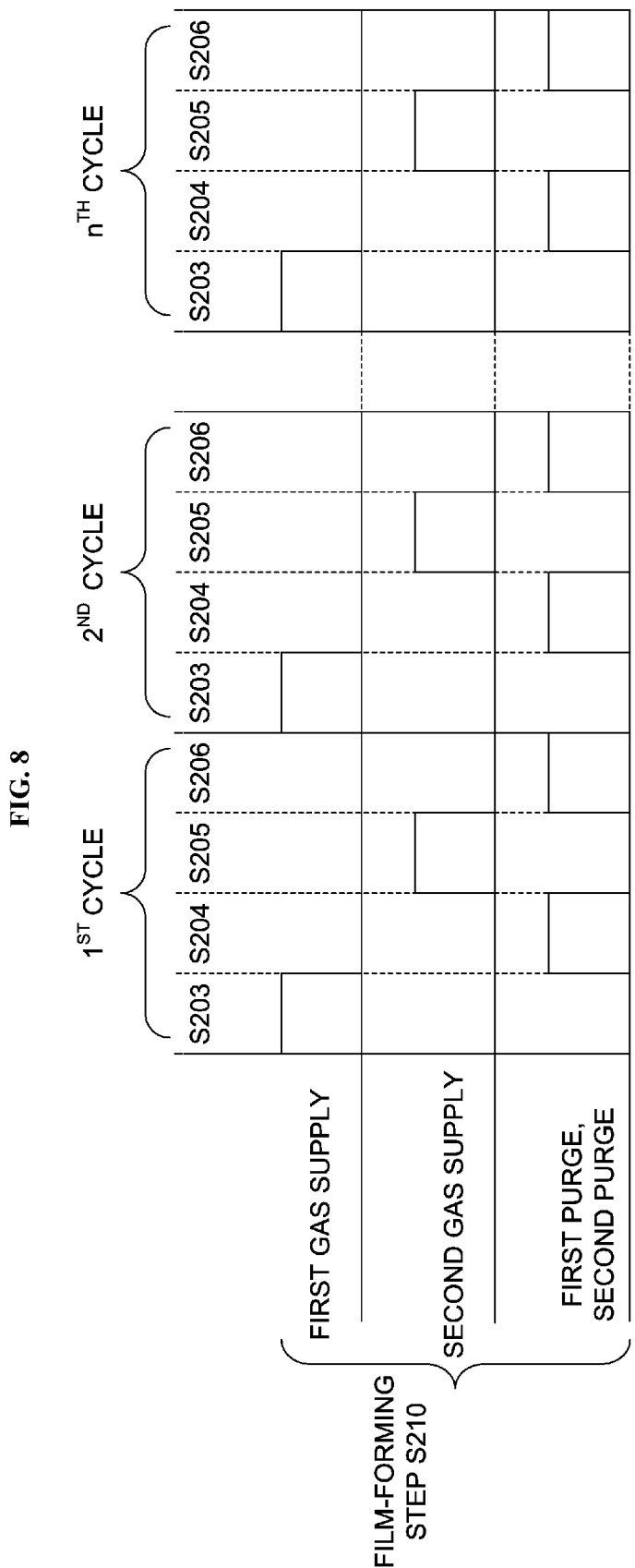
FIG. 8 is a sequence diagram of the first substrate processing according to the embodiment.

After the substrate 200 is placed on the substrate support part 210, steps S203 through S207 shown in FIGS. 7 and 8 are performed.

First Gas Supply Step S203

In the first gas supply step S203, an aminosilane-based gas serving as the first gas (source gas) is supplied into the process chamber 201 by the first gas supply system. For example, in the embodiment, bis (diethylamino) silane ($H_2Si(NEt_2)_2$, abbreviated as BDEAS) gas may be used as the aminosilane-based gas. Specifically, the gas valve (tank side valve) 160 is opened to supply the aminosilane-based gas into the chamber 100 from the process gas source 113. When the aminosilane-based gas is supplied, the process chamber side valves 116a and 116b are opened and the flow rates of the aminosilane-based gas are adjusted by the MFCs 115a and 115b. The aminosilane-based gas having the flow rate thereof adjusted is then supplied to the depressurized process chamber 201 through the buffer space 232 and the holes of the shower head 234. The exhaust system continuously exhausts the process chamber 201 such that the inner pressure of the process chamber 201 is maintained at a predetermined pressure. With the inner pressure of the process chamber 201 is maintained at the predetermined pressure, the aminosilane-based gas is supplied to the substrate 200 in the process chamber 201 at a first pressure. For example, the first pressure may range from 100 Pa to 20,000 Pa. As described above, the aminosilane-based gas is supplied onto the substrate 200 in the process chamber 201. As a result, a silicon-containing layer is formed on the substrate 200.

In the first gas supply step S203, the temperature of the heater 213 is maintained at a predetermined temperature ranging from 200° C. to 750° C., preferably from 300° C. to 600° C., more preferably from 300° C. to 550° C. The temperature of the heater 213 is maintained at the predetermined temperature until at least the film-forming step S210 is completed.

First Purge Step S204

After the silicon-containing layer is formed on the substrate 200, the gas valves (process chamber side valves) 116a and 116b of the first gas supply pipes 111a and 111b are closed to stop the supply of the aminosilane-based gas. The first purge step S204 is performed by stopping the supply of the source gas (aminosilane-based gas) and exhausting the source gas present in the process chamber 201 or the source gas present in the buffer space 232 through the process chamber exhaust pipes 224a and 224b.

In the first purge step S204, the remaining gas may be extruded by further supplying a purge gas such as an inert gas in addition to vacuum-exhausting the remaining gas. Specifically, the valves (process chamber side valves) 136a and 136b are opened to supply the inert gas. For example, $N_2$ gas may be used as the inert gas. The vacuum exhaust may be combined with the supply of the inert gas. Alternatively, the vacuum exhaust and the supply of the inert gas may alternately be performed.

In the first purge step S204, the vacuum pump 223 continues to operate to exhaust the gas present in the process chamber 201.

After a predetermined time elapses, the supply of the inert gas is stopped by closing the valves (process chamber side valves) 136a and 136b.

The flow rates of the $N_2$ gas serving as the purge gas supplied through each inert gas supply system, may range, for example, from 100 sccm to 20,000 sccm, respectively. Instead of the $N_2$ gas, rare gases such as argon (Ar) gas, helium (He) gas, neon (Ne) gas and xenon (Xe) gas may be used as the purge gas.

Second Gas Supply Step S205

After the first purge step S204 is completed, the valves (process chamber side valves) 126a and 126b are opened, and an oxygen (O)-containing gas serving as the second gas (reactive gas) is supplied into the process chamber 201 via the gas introduction port 241, the buffer space 232 and the shower head 234. For example, the oxygen-containing gas may include oxygen gas ($O_2$), ozone gas ($O_3$), water ($H_2O$) and nitrous oxide gas ($N_2O$). In the embodiment, for example, the oxygen gas ($O_2$) is used as the oxygen-containing gas. Since the oxygen-containing gas is supplied into the process chamber 201 through the buffer space 232 and the shower head 234, it is possible to uniformly supply the oxygen-containing gas onto the substrate 200. Therefore, it is possible to make the thickness of a film formed on the substrate 200 uniform. The second gas may be supplied into the process chamber 201 in an activated state by the remote plasma unit (RPU) 124 serving as the activation mechanism (excitation mechanism).

In the second gas supply step S205, the flow rate of the $O_2$ gas is adjusted by the MFC 125a and 125b to a predetermined amount. For example, the flow rate of the $O_2$ gas may range from 100 sccm to 10,000 sccm. The APC 222a serving as a pressure controller is appropriately adjusted in order to adjust the inner pressure of the process chamber 201 within a predetermined pressure range. In addition, when the $O_2$ gas flows through the RPU 124, the RPU 124 may be controlled to an ON state (a state that power is turned on) to activate (excite) the $O_2$ gas.

When the $O_2$ gas is supplied to the silicon-containing layer formed on the substrate 200, the silicon-containing layer is modified. For example, the silicon-containing layer is modified to a modified layer containing silicon (Si) and oxygen (O). By providing the RPU 124 and supplying the $O_2$ gas activated by the RPU 124 onto the substrate 200, more modified layers can be formed.

The modified layer having a predetermined thickness, a predetermined distribution and a predetermined penetration depth of the oxygen component is formed on the substrate 200 depending on the conditions such as the inner pressure of the process chamber 201, the flow rate of the $O_2$ gas, the temperature of the substrate 200 and the power supply condition of the RPU 124.

After a predetermined time elapses, the supply of the inert gas is stopped by closing the valves (process chamber side valves) 126a and 126b.

Second Purge Step S206

In the second purge step S206, the supply of the $O_2$ gas is stopped and the $O_2$ gas present in the process chamber 201 or the $O_2$ gas present in the buffer space 232 is exhausted by the first exhaust system. The second purge step S206 same as the first purge step S204 is performed.

Determination Step S207

After the second purge step S206 is completed, the controller 260 determines whether a cycle (of the film-forming step S210) including the step S203 through the step S206 is performed a predetermined number of times (C times, C is a natural number). That is, the controller 260 determines whether a film having a desired thickness is formed on the substrate 200. An insulating film having the desired thickness and containing silicon (Si) and oxygen (O) (that is, the SiO film) may be formed by performing the cycle including the step S203 through the step S206 at least once. It is preferable that the cycle is performed multiple times until the SiO film having the desired thickness is formed on the substrate 200.

When the controller 260 determines, in the determination step S207, that the cycle is not performed the predetermined number of times ("NO" in FIG. 7), the cycle including the step S203 through the step S206 is repeated. When the controller 260 determines, in the determination step S207, that the cycle is performed the predetermined number of times ("YES" in FIG. 7), the film-forming step S210 is terminated and a pressure adjusting step S208 and a substrate unloading step S209 are performed.

Pressure Adjusting Step S208

In the pressure adjusting step S208, the process chamber 201 or the transfer chamber 203 is exhausted through the process chamber exhaust pipes 224a and 224b until the inner pressure of the process chamber 201 or the inner pressure of the transfer chamber 203 reaches a predetermined level (vacuum level). In the pressure adjusting step S208, the inner pressure of the process chamber 201 or the inner pressure of the transfer chamber 203 is adjusted to be equal to or greater than the inner pressure of the vacuum transfer chamber 1400. Before, during or after the pressure adjusting step S208, the substrate 200 may be supported by the lift pins 207 until the substrate 200 is cooled down to a predetermined temperature.

Substrate Unloading Step S209

After the inner pressure of the process chamber 201 is adjusted to a predetermined pressure in the pressure adjusting step S208, the gate valve 1490 is opened. Then, the substrate 2300 is unloaded from the transfer chamber 203 to the vacuum transfer chamber 1400.

As described above, the substrate 200 is processed.

However, the inventors of the present application have found that at least one of the following problems A through D occurs when a plurality of types of film-forming steps are performed using the substrate processing system 1000 having the plurality of chambers 100a through 100h as shown in FIG. 1.

Problem A

When the film-forming step S210 is performed in each of the chambers 100a through 100h, the accumulated processing time of the film-forming step S210 may be different for each of the chambers 100a to 100h and the accumulated film thickness deposited in each of the chambers 100a to 100h may be different for each of the chambers 100a through 100h. Thus, the maintenance timing of the chambers 100a to 100h may be different for each of the chambers 100a to 100h. When the maintenance timing is different for each of the chambers 100a to 100h, the productivity of the substrate processing system 1000 may deteriorate.

In order to address the above-described problem, it is possible to stop the substrate processing in the chambers under maintenance among the chambers 100a through 100h and perform the substrate processing in the other chambers among the chambers 100a through 100h, which are not under maintenance. However, a transfer path of the substrate 200 must be changed so that the substrate 200 is not transferred to the chamber where the substrate processing is stopped. Thus, the productivity of the substrate processing system 1000 deteriorates.

Figure 9:
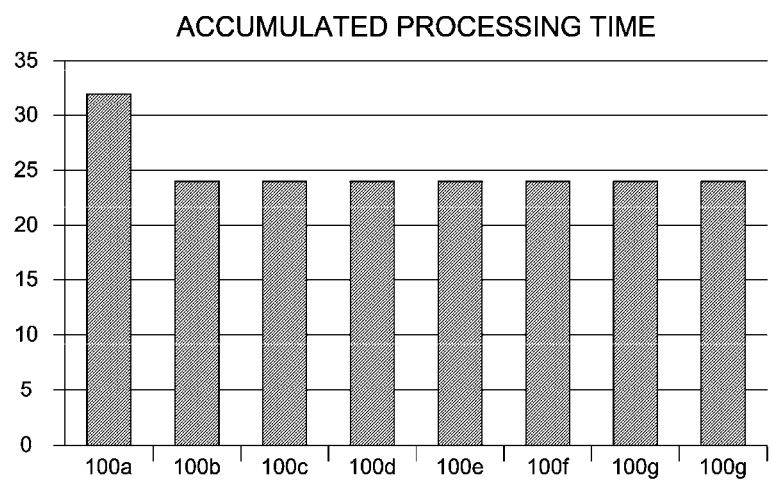
FIG. 9 schematically illustrates an accumulated processing time according to a transfer sequence.
Figure 10:
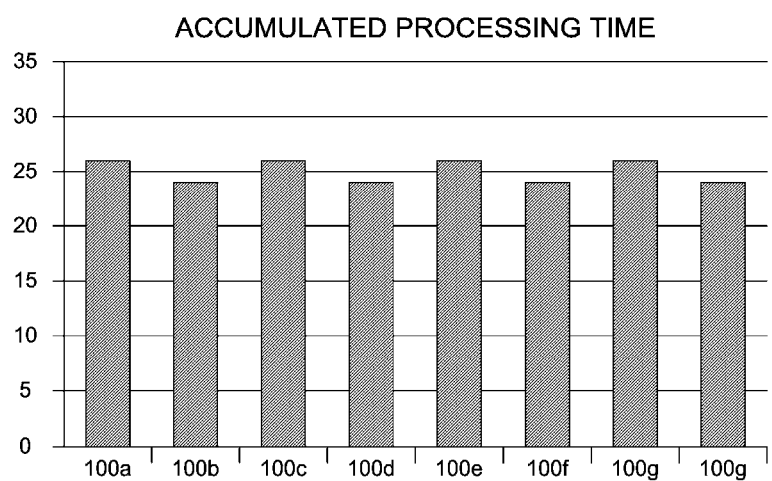
FIG. 10 schematically illustrates another accumulated processing time according to another transfer sequence.

An example in which the accumulated processing time is different will be described with reference to FIGS. 9 and 10. In graphs shown in FIGS. 9 and 10, the horizontal axes represent the chambers 100a through 100h of the PMs 110a, 110b, 110c and 110d (indicated by "PM1", "PM2", "PM3" and "PM4" in FIGS. 9 and 10, respectively) and the vertical axes represent the accumulated processing time (in arbitrary unit). In tables shown in FIGS. 9 and 10, non-hatched portions indicate the substrate processing of the odd-numbered pod 1001, and the adjacent hatched portions indicate the substrate processing of the even-numbered pod 1001. For example, the graphs in FIGS. 9 and 10 are obtained by counting the accumulated processing time of each of the chambers 100a through 100h when the substrate processing is performed in the chambers 100a through 100h using eight pods 1001 having 25 substrates 200. FIG. 9 schematically illustrates the accumulated processing time according to a transfer sequence where the first and second substrates 200 among the substrates 200 in the pod 1001 are transferred to the PM 110a ("PM1"). FIG. 10 schematically illustrates the accumulated processing time according to another transfer sequence where the first and second substrates 200 among the substrates 200 in the pod 1001 are transferred to the PM which is next to the PM where the last substrate 200 of the previous pod 1001 is processed. Specifically, according to another transfer sequence, when the last substrate 100 among the substrates 100 in the first pod 1001 is processed in the chamber 100a of the PM 110a ("PM1"), the first and second substrates 100 in the next pod (second pod) 1001 are transferred to the chamber 100c and the chamber 100d of the next PM 110b ("PM2"), respectively. In other words, according to the example shown in FIG. 10, the first and second substrates 100 in the next pod 1001 are transferred to the chambers of the PM having the smallest accumulated processing time.

As shown in FIGS. 9 and 10, when the substrates 200 are processed with the processing time of 1 (in arbitrary unit) in each of the chambers 100a through 100h, the accumulated processing time are different in each of the chambers 100a through 100h. Thus, the maintenance timing differs in each of the chambers 100a through 100h. The reason will be described below.

When 200 substrates 200 are processed, as shown in FIG. 9, a time difference of 8 (in arbitrary unit) occurs in the accumulated processing time between the chamber 100a and the other chambers 100b through 100h. As shown in FIG. 10, a time difference of 2 (in arbitrary unit) occurs in the accumulated processing time between the chambers 100a, 100c, 100e and 100g and the other chambers 100b, 100d, 100f and 100h.

The accumulated processing time is not simply proportional to the number of times of the use of each of the chambers 100a through 100h (i.e., the number of times of the substrate processing performed in each of the chambers 100a through 100h). Thus, it is difficult to estimate the maintenance timing based only on the number of times of the substrate is processed in each of the chambers 100a through 100h. For example, when semiconductor devices are manufactured in small lots and various types of the products, the processing time may be different for each processing lot and each pod 1001. Therefore, even if the number of times of the substrate processing performed in one chamber 100 of the PM is large, the other chamber 100 of the PM may have a smaller accumulated processing time. In addition, as shown in FIG. 10, when the substrates 200 are transferred to the PM having the smallest number of times of the substrate processing, the number of times of the use of the specific chamber 100 may be biased. For example, the accumulated processing time of the most frequently used chamber 100 (specific chamber 100) continues to increase, so that the performance of the specific chamber 100 may deteriorate.

Problem B

When the plurality of chambers 100a through 100h are provided in the process modules (PMs) 110a through 110d, the exhaust systems of at least a part of the plurality of chambers 100a to 100h are used in common. Thus, it is not possible to perform the maintenance in one chamber 100 of the PM while the substrate 200 is processed in the other chamber 100 of the PM. When the maintenance is performed in the one chamber 100 of the PM, by-products are generated in the exhaust pipe. Thus, the by-products may flow into the other chamber 100 of the PM. In addition, the inner pressure of the other chamber 100 of the PM may also be affected by the maintenance in the one chamber 100 of the PM. As described above, when the maintenance is performed in the one chamber 100 of the PM, the substrate processing in the other chamber 100 of the PM may be restricted. Therefore, it is not possible to process the substrate 200 with the PM having the chamber 100 under maintenance. Thus, the productivity of the substrate processing system 1000 may be decreased. For example, in the example shown in FIG. 9, the chamber 100b of the PM1 cannot be used during the maintenance of the chamber 100a of the PM1. In the example shown FIG. 10, all the chambers of the PMs are unavailable during the maintenance.

Problem C

When the plurality of chambers 100a through 100h are provided in the process modules (PMs) 110a through 110d, the substrate 200 may be transferred to one chamber 100 of the PM and the substrate processing may be started to the substrate 200 in the one chamber 100 of the PM while the other chamber 100 of the PM is empty (that is, the substrate 200 is not transferred to the other chamber 100 of the PM). The substrate processing is performed in the one chamber 100 of the PM where the substrate 200 is transferred. The substrate processing in the one chamber 100 of the PM where the substrate 200 is transferred is referred to as a "normal deposition". On the other hand, in the other chamber 100 of the PM where the substrate 200 is not transferred, a film is deposited on the substrate placing surface 211 of the substrate support 212. The substrate processing in the other chamber 100 of the PM where the substrate 200 is not transferred is referred to as an "empty deposition". When the accumulated processing time of the empty deposition increases, the inner atmosphere of the one chamber 100 of the PM where the normal deposition is performed becomes different from the inner atmosphere of the other chamber 100 of the PM where the empty deposition is performed. Thus, the characteristics of the film formed on the substrate 200 are changed for the one chamber 100 and the other chamber 100 of the PM. In addition, when the accumulated processing time of the empty deposition increases, the number or frequency of occurrences of the particles in the other chamber 100 of the PM where the empty deposition is performed increases compared to the one chamber 100 of the PM where the normal deposition is performed. The maintenance timing also varies between the one chamber 100 and the other chamber 100 of the PM. Since the film is formed on the substrate placing surface 211 in accordance with the empty deposition, the contents of the maintenance should be changed for the one chamber 100 and the other chamber 100 of the PM. For example, it is necessary to increase the cleaning time for the other chamber 100 of the PM in order to remove the film formed on the substrate placing surface 211. If the cleaning time is increased, the parts such as the shower head 234, the inner wall of the upper vessel 202a, the surface of the partition plate 204 and the outer peripheral surface 215 of the substrate support 212 may be over-etched. Therefore, the inner atmosphere of the process chamber 201 may be remarkably changed.

Problem D

Recently, in the semiconductor devices, a stacked structure such as a 3D-NAND is mainly used. In the stacked structure, films of the same type are formed a plurality of times. In the stacked structure, it is required that the characteristics of each of the films are within the range of predetermined film characteristics. The films of the same type may be formed by the same substrate processing apparatus (that is, the same chamber). However, if an inner environment of the chamber 100 is changed for each film-forming step, the characteristics of each film may not be within the range of predetermined film characteristics.

In the present specification, the characteristics of the film refers to the characteristics such as the thickness of the film, the quality of the film, the crystallinity of the film, the dielectric constant of the film, the refractive index of the film, the density of the film and the etching rate of the film. The inner environment of the chamber 100 is changed by, for example, the following:

i) The base pressure in the chamber 100 is changed according to an accumulated film thickness formed on the surface of the parts in the chamber 100 described above.

ii) The environment in the gas pipes of each gas supply system is changed according to an accumulated supply time of the gas to the chamber 100.

iii) The amount of particles generated in each chamber 100 is increased according to the accumulated film thickness and the accumulated processing time.

The inventors of the present application confirmed that at least one of the above-described problems can be addressed by performing a correction step of a substrate transfer step described below. The substrate transfer step including the correction step will be described with reference to FIGS. 11, 12, 13, and 14.

Substrate Transfer Step

First, the substrate transfer step will be described with reference to FIG. 11. FIG. 11 is a flow chart illustrating a substrate transfer sequence including the correction step of the substrate transfer step according to the embodiment.

First Substrate Transfer Step S300

The substrates 200 are transferred to the plurality of chambers 100a though 100h in a predetermined order from the pod 1001 serving as a storage container, and the substrate processing is performed in the plurality of chambers 100a though 100h sequentially. In the present specification, the predetermined order refers to, for example, the order of the chamber 100a, the chamber 100b, the chamber 100c, the chamber 100d, the chamber 100e, the chamber 100f, the chamber 100g and the chamber 100h. In addition, the order may not start from the chamber 100a. For example, the order may start from the chamber 100c. That is, the substrate 200 may be preferentially transferred to the chamber 100c. When the substrate 200 is preferentially transferred to the chamber 100c, the predetermined order refers to, for example, the order of the chamber 100c, the chamber 100d, the chamber 100e, the chamber 100f, the chamber 100g, the chamber 100h, the chamber 100a and the chamber 100b. The transfer of the substrates 200 from the pod 1001 to each of the chambers 100 is repeated until all of the substrates 200 in the pod 1001 to be processed are transferred to each of the chambers 100. After the first substrate transfer step S300 is completed, a correction step S301 of the substrate transfer step is performed.

Correction Step S301

In the correction step S301, a first count data generation step S302, a transfer flag data assigning step S303, a first determination step S304 and a transfer start position changing step S305 are performed. Each step will be described below.

First Count Data Generation Step S302

In the first count data generation step S302, the CPU 260a serving as an arithmetic unit of the controller 260 generates first count data corresponding to each of the plurality of process chambers of the process modules (PMs), and stores the first count data in the memory device 260c serving as a memory mechanism. In the present specification, the first count data may include information such as the accumulated processing time in the chamber 100, the accumulated film thickness, the accumulated supply time of the process gas, the accumulated supply time of the reactive gas, the accumulated time of maintaining the process pressure, the accumulated time of maintaining the substrate support 212 at the process temperature, and the accumulated discharge time of the plasma generated in the process chamber 201. The first count data is selected from at least one of the above described information. That is, two or more of the above-described information may be selected to generate the first count data.

FIG. 12 schematically illustrates an example of a data table in which the first count data is recorded. In the data table shown in FIG. 12, the first count data corresponding to each of the chambers 100*a* through 100*h* is input to each data input box (that is, field). Specifically, the accumulated processing time data corresponding to each of the chambers 100*a* through 100*h* is recorded in fields A1, B1, C1, . . . , H1. The accumulated time of maintaining the temperature corresponding to each of the chambers 100*a* through 100*h* is recorded in fields A2, B2, C2, . . . , H2. The accumulated supply amount of the process gas corresponding to each of the chambers 100*a* through 100*h* is recorded in fields A3, B3, C3, . . . , H3. The accumulated time of maintaining the process pressure corresponding to each of the chambers 100*a* through 100*h* is recorded in fields A4, B4, C4, . . . , H4. The accumulated thickness data of the film corresponding to each of the chambers 100*a* through 100*h* is recorded in fields A5, B5, C5, . . . , H5. The supply amount of high frequency power corresponding to each of the chambers 100*a* through 100*h* is recorded in fields A6, B6, C6, . . . , H6. In the embodiment, the accumulated processing time, the accumulated time of maintaining the temperature, the accumulated supply amount of the process gas, the accumulated time of maintaining the process pressure, the accumulated film thickness and the supply amount of the high frequency power are shown as the first count data. However, the first count data may include one of the above-described data. Alternatively, the first count data may further include the above-described information such as the accumulated time of maintaining the substrate support 212 at the process temperature and the accumulated discharge time of the plasma generated in the process chamber 201. In addition, the first count data may be constituted by replacing a part of the data shown in FIG. 12 with the above-described information. The accumulated film thickness may be measured by providing the film thickness meter 402 in the process chamber 201. Alternatively, without providing the film thickness meter 402, it is possible to calculate the accumulated film thickness based on at least one of information such as the accumulated supply time of one or both of the process gas and the reactive gas, the process pressure and the number of processed substrates 200. In addition, when the thickness data of the film is input to the process recipe (film-forming recipe), the accumulated film thickness may be calculated based on the thickness data of the film in the film-forming recipe and the number of times of performing the film-forming recipe.

Transfer Flag Data Assigning Step S303

Subsequently, a comparison operation is performed for each of the first count data corresponding to the plurality of the process chambers, and transfer flag data is generated. Specifically, the first count data corresponding to the plurality of the process chambers are compared, and the transfer flag data is assigned to the chamber 100 corresponding to the largest first count data among the first count data. FIG. 13 schematically illustrates an example of a data table of the transfer flag data. Specifically, FIG. 13 schematically illustrates a state in which the results are recorded in the input box (fields) Xa, Xb, Xc, . . . , Xh for the transfer flag data after comparing and calculating the accumulated processing time serving as the first count data. In FIG. 13, "1" is stored as a flag in the input box (field) Xa of the chamber 100*a* having the largest accumulated processing time, and "0" indicating that there is no flag is stored in the other input boxes (fields) Xb through Xh. When the flag data is already stored in each input box, the flag data in each input box is changed based on the calculation result.

First Determination Step S304

Subsequently, the first determination step S304 is performed. In the first determination step S304, the controller 260 determines whether or not the transfer flag corresponding to each of the chambers 100*a* through 100*h* is changed. As a result of the determination, when the controller 260 determines that the transfer flag is changed ("YES" in FIG. 11) in the first determination step S304, the transfer start position changing step S305 is performed. When the controller 260 determines that the transfer flag is not changed ("NO" in FIG. 11) in the first determination step S304, the second substrate transfer step S306 is performed without performing the transfer start position changing step S305.

Transfer Start Position Changing Step S305

Subsequently, the transfer start position changing step S305 is performed when the controller 260 determines that transfer flag is changed ("YES" in FIG. 11) in the first determination step S304. When the controller 260 determines that transfer flag is changed ("YES" in FIG. 11) in the first determination step S304, a substrate transfer recipe is updated so that the transfer of the substrate 200 starts from the chamber next to the chamber to which the transfer flag is assigned. In the example shown in FIG. 13, since the transfer flag is assigned to the chamber 100*a*, the substrate transfer recipe is updated so that the transfer of the substrate 200 starts from the chamber 100*b* in the second substrate transfer step S306. In this manner, the substrate 200 is transferred to the chamber next to the chamber having the largest first count data among the plurality of the first count data. Depending on the transfer flag, a transfer destination of the substrate 200 to be transferred first in the next pod 1001 may be the same before and after the update of the substrate transfer recipe.

Second Substrate Transfer Step S306

Subsequently, the second substrate transfer step S306 is performed. In the second substrate transfer step S306, according to the similar procedure as the above-described first substrate transfer step S300, the transfer of the substrates 200 from the pod 1001 to each of the chambers 100 is repeated until all of the substrates 200 in the pod 1001 to be processed are transferred to each of the chambers 100 based on the substrate transfer recipe.

Second Determination Step S307

Next, the second determination step S307 is performed. In the second determination step S307, the controller 260 determines whether or not the next pod 1001 to be processed next is placed on the I/O stage 1100. When the controller 260 determines that the next pod 1001 is placed on the I/O stage 1100 ("YES" in FIG. 11) in the second determination step S307, the correction step S301 is performed. The correction step S301 and the second substrate transfer step S306 are repeated until there is no pod 1001 to be processed. When the controller 260 determines that there is no pod 1001 to be processed ("NO" in FIG. 11) in the second determination step S307, the substrate processing is terminated.

As described above, the substrate processing according to the embodiment is performed.

Other Embodiments

While the technique is described in detail by way of the above-described embodiment, the above-described technique is not limited thereto. The above-described technique may be modified in various ways without departing from the gist thereof.

While in the above embodiment the substrate transfer order is corrected in the unit of the chamber 100 based on the first count data, the above-described technique is not limited thereto. For example, the substrate transfer order may be corrected in units of the process module (PM) by the following configuration. For example, as shown in FIG. 14, second count data corresponding to each of the PMs may be generated based on the first count data corresponding to each of the chambers 100a through 100h. In the present specification, the second count data refers to data obtained by calculating the summation of the first count data corresponding to the chambers 100 of the PM. Specifically, the second count data AB1 corresponding to the PM1 refers to data obtained by calculating the summation of the first count data A1 of the chamber 100a of the PM1 and the first count data B1 of the chamber 100b of the PM1. The second count data corresponding to the other PMs such as the PM2, the PM3 and the PM4 is calculated in the same manner. In the present specification, although the second count data is calculated based on the two first count data (for example, the first count data A1 and the first count data B1), the second count data may be calculated based on three or more first count data when the PM has three or more chambers 100. In addition, although in the above example the second count data is calculated by obtaining the summation of the first count data corresponding to the chambers 100 of the PM, the second count data may be calculated by arbitrary calculation processing.

In addition, the number of substrates 200 to be processed in the pod 1001 may not be divided without remainder by the number of chambers included in the substrate processing system 1000. Thus, in the PM where the last substrate 200 among the substrates 200 in the pod 1001 is transferred, the substrate 200 may be transferred to one chamber 100 of the PM while the substrate 200 is not transferred to the other chamber 100 of the PM. That is, the other chamber 100 of the PM is empty. When the other chamber 100 of the PM is empty, instead of generating the first count data corresponding to the other chamber 100 of the PM, the first count data corresponding to the other chamber 100 of the PM may be set to zero (0). The second count data may be calculated according to the first count data of the chambers of the PM, as shown in the input boxes (fields) in the lower portion of FIG. 14. Referring to the lower portion of FIG. 14, the second count data of the PM1 is calculated based on the first count data of the chamber 100a of the PM1 where the substrate 200 is transferred and the first count data of the chamber 100b of the PM1 where the substrate 200 is not transferred. The accumulated processing time of the chamber 100b is set to zero (0), and the accumulated processing time of the chamber 100a is set to the second count data of the PM1. When the second count data of the PM1 is compared with the second count data of other PMs, that is, PM2, PM3 and PM4, the second count data of the PM1 is the minimum. Thus, the transfer flag is not assigned to the PM1, and, for example, the transfer flag is assigned to the PM2, as shown in FIG. 14. The second count data may be calculated as described above.

While the embodiment wherein the source gas and the reactive gas are alternately supplied to form the film is exemplified above, the above-described technique is not limited thereto. For example, the above-described technique may be applied to other methods as long as the amount of the gas phase reaction of the source gas and the reactive gas and the amount of by-products generated by the gas phase reaction are within an acceptable range. For example, the above-described technique may be applied even when the supply of the source gas and the supply of the reactive gas are at least partially overlapped.

In addition, while the process module having a pair of chambers is exemplified above, the above-described technique is not limited thereto. For example, the above-described technique may also be applied to a process module having a set of three or more chambers. When the process module has three or more chambers and the substrate is transferred to one chamber and is not transferred to at least one chamber other than the one chamber, the process gas is supplied to the one chamber and the inert gas is supplied to the other chambers, and thus the above-described effects may be obtained.

In addition, while the single substrate processing apparatus in which the substrates are processed one by one is exemplified above, the above-described technique is not limited thereto. For example, the above-described technique may also be applied to a batch type substrate processing apparatus in which a plurality of substrates are disposed in the process chamber in a vertical direction or a horizontal direction.

For example, the above-described technique may be applied to other processes instead of the film-forming process exemplified above. That is, the above-described technique may also be applied to a diffusion process, an oxidation process, a nitridation process, an oxynitridation process, a reduction process, an oxidation-reduction process, an etching process and a heating process. For example, the above-described technique may also be applied to a plasma oxidation process or a plasma nitridation process of a substrate or a film formed on the substrate using only the reactive gas. The above-described technique may also be applied to a plasma annealing process using only the reactive gas.

While the manufacturing process of a semiconductor device is exemplified above, the above-described technique may be applied to other manufacturing processes. For example, the above-described technique may be applied to a substrate processing such as a manufacturing process of a liquid crystal device, a manufacturing process of a solar cell, a manufacturing process of a light emitting device, a processing of a glass substrate, a processing of a ceramic substrate and a processing of a conductive substrate.

While the embodiment wherein a silicon oxide (SiO) film is formed using a silicon-containing gas serving as the source gas and an oxygen-containing gas serving as the reactive gas is described above, the above-described technique may be applied to the formations of other films using different gases. For example, the above-described technique may also be applied to formations of an oxygen-containing film, a nitrogen-containing film, a carbon-containing film, a boron-containing film, a metal-containing film and combinations thereof. For example, the above-described technique may also be applied to formations of a silicon nitride (SiN) film, an aluminum oxide (AlO) film, a zirconium oxide (ZrO) film, a hafnium oxide (HfO) film, a hafnium aluminum oxide (HfAlO) film, a zirconium aluminum oxide (ZrAlO) film, a silicon carbide (SiC) film, a silicon carbonitride (SiCN) film, a silicon boronitride (SiBN) film, a titanium nitride (TiN) film, a titanium carbide (TiC) film and a titanium aluminum carbide (TiAlC) film.

According to the technique described herein, it is possible to improve the productivity of a substrate processing system including a plurality of process chambers.

What is claimed is:

1. A method of manufacturing a semiconductor device, comprising:
   (a) placing a first storage container of a plurality of storage containers where substrates are accommodated on a loading port shelf;
   (b) transferring the substrates in a predetermined order from the first storage container to process chambers capable of processing the substrates;
   (c) performing a processing in each of the process chambers;
   (d) generating first count data corresponding to each of the process chambers, wherein the first count data comprises at least one first count data selected from the group consisting of: an accumulated processing time of the processing; an accumulated film thickness of at least one of the substrates; an accumulated supply time of a process gas used for the processing; an accumulated supply time of a reactive gas used for the processing; an accumulated time of maintaining a process pressure during the processing; an accumulated time of maintaining a process temperature during the processing; and an accumulated discharge time of plasma generated during the processing;
   (e) storing the first count data;
   (f) assigning transfer flag data to, among the process chambers, one of the process chambers corresponding to a maximum of the first count data; and
   (g) transferring substrates accommodated in a second of the storage containers in the predetermined order from the second storage container to another of the process chambers located next to the one of the process chambers to which the transfer flag data is assigned in (f).

2. The method of claim 1, wherein a process module comprises two or more of the process chambers, further comprising:
   (h) generating second count data from the first count data corresponding to each of the two or more of the process chambers contained in the process module.

3. The method of claim 2, wherein the second count data is calculated in (h) by obtaining a summation of the first count data corresponding to each of the two or more of the process chambers contained in the process module.

4. The method of claim 3, wherein no substrate exists in at least one of the process chambers, and the first count data corresponding to the at least one of the process chambers is generated when the processing is performed in another of the process chambers.

5. The method of claim 3, wherein no substrate exists in at least one of the process chambers, and the first count data corresponding to the at least one of the process chambers is not generated when the processing is performed in another of the process chambers.

6. The method of claim 2, wherein no substrate exists in at least one of the process chambers, and the first count data corresponding to the at least one of the process chambers is generated when the processing is performed in another of the process chambers.

7. The method of claim 2, wherein no substrate exists in at least one of the process chambers, and the first count data corresponding to the at least one of the process chambers is not generated when the processing is performed in another of the process chambers.

8. The method of claim 2, wherein number of the substrates transferred in (g) corresponds to number of the process chambers contained in the process module.

9. The method of claim 1, wherein no substrate exists in at least one of the process chambers, and the first count data corresponding to the at least one of the process chambers is generated when the processing is performed in another of the process chambers.

10. The method of claim 1, wherein no substrate exists in at least one of the process chambers, and the first count data corresponding to the at least one of the process chambers is not generated when the processing is performed in another of the process chambers.

11. The method of claim 1, further comprising:
    (i) reading, from a memory device, data comprising the accumulated processing time as the first count data.

12. The method of claim 1, further comprising:
    (j) reading, from a memory device, data comprising the accumulated film thickness as the first count data.

* * * * *